United States Patent
Vadlamani et al.

(10) Patent No.: US 11,862,552 B2
(45) Date of Patent: Jan. 2, 2024

(54) METHODS OF EMBEDDING MAGNETIC STRUCTURES IN SUBSTRATES

(71) Applicant: INTEL CORPORATION, Santa Clara, CA (US)

(72) Inventors: Sai Vadlamani, Chandler, AZ (US); Prithwish Chatterjee, Tempe, AZ (US); Robert A. May, Chandler, AZ (US); Rahul S. Jain, Chandler, AZ (US); Lauren A. Link, Chandler, AZ (US); Andrew J. Brown, Chandler, AZ (US); Kyu Oh Lee, Chandler, AZ (US); Sheng C. Li, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/567,639

(22) Filed: Jan. 3, 2022

(65) Prior Publication Data
US 2022/0130748 A1      Apr. 28, 2022

Related U.S. Application Data

(62) Division of application No. 15/855,453, filed on Dec. 27, 2017, now Pat. No. 11,251,113.

(51) Int. Cl.
*H01L 23/498* (2006.01)
*H01F 17/00* (2006.01)
(Continued)

(52) U.S. Cl.
CPC ... *H01L 23/49838* (2013.01); *H01F 17/0013* (2013.01); *H01F 17/0033* (2013.01);
(Continued)

(58) Field of Classification Search
CPC .......... H01L 23/49838; H01L 21/4853; H01L 21/4857; H01L 21/486; H01L 23/498; H01L 23/49811; H01L 23/49822; H01L 23/49866; H01L 24/19; H01L 24/20; H01L 24/16; H01L 24/48; H01L 24/81; H01L 2224/16157; H01L 2224/16227; H01L 2224/48227; H01L 2224/81191;
(Continued)

(56) References Cited

U.S. PATENT DOCUMENTS

| 6,996,892 B1 | 2/2006 | Dening et al. |
| 2009/0237899 A1 | 9/2009 | Furnival |

(Continued)

OTHER PUBLICATIONS

Office Action for German Patent Application No. 102018129645.2, dated Feb. 21, 2019.
(Continued)

*Primary Examiner* — Thanh T Nguyen
(74) *Attorney, Agent, or Firm* — Essential Patents Group, LLP

(57) ABSTRACT

Methods/structures of forming embedded inductor structures are described. Embodiments include forming a first interconnect structure on a dielectric material of a substrate, selectively forming a magnetic material on a surface of the first interconnect structure, forming an opening in the magnetic material, and forming a second interconnect structure in the opening. Build up layers are then formed on the magnetic material.

7 Claims, 24 Drawing Sheets

(51) Int. Cl.
*H01F 41/04* (2006.01)
*H05K 1/00* (2006.01)
*H01L 23/00* (2006.01)
*H01F 27/28* (2006.01)
*H01F 27/40* (2006.01)
*H01L 21/48* (2006.01)

(52) U.S. Cl.
CPC ......... *H01F 27/2804* (2013.01); *H01F 27/40* (2013.01); *H01F 41/043* (2013.01); *H01F 41/046* (2013.01); *H01L 21/486* (2013.01); *H01L 21/4853* (2013.01); *H01L 21/4857* (2013.01); *H01L 23/498* (2013.01); *H01L 23/49811* (2013.01); *H01L 23/49822* (2013.01); *H01L 23/49866* (2013.01); *H01L 24/19* (2013.01); *H01L 24/20* (2013.01); *H05K 1/00* (2013.01); *H01F 2017/0066* (2013.01); *H01F 2027/2809* (2013.01); *H01L 24/16* (2013.01); *H01L 24/48* (2013.01); *H01L 24/81* (2013.01); *H01L 2224/16157* (2013.01); *H01L 2224/16227* (2013.01); *H01L 2224/48227* (2013.01); *H01L 2224/81191* (2013.01); *H01L 2224/81192* (2013.01); *H01L 2224/81193* (2013.01); *H01L 2224/81447* (2013.01); *H01L 2224/81815* (2013.01); *H01L 2924/00014* (2013.01); *H01L 2924/19042* (2013.01); *H01L 2924/19102* (2013.01)

(58) Field of Classification Search
CPC . H01L 2224/81192; H01L 2224/81193; H01L 2224/81447; H01L 2224/81815; H01L 2924/00014; H01L 2924/19042; H01L 2924/19102; H01L 2224/131; H01L 23/49827; H01L 21/76838; H01L 23/5283; H01L 23/53209; H01F 17/0013; H01F 17/0033; H01F 27/2804; H01F 27/40; H01F 41/043; H01F 41/046; H01F 2017/0066; H01F 2027/2809; H05K 1/00; H05K 3/4644; H05K 2201/086; H05K 1/115; H05K 1/165

See application file for complete search history.

(56) References Cited

U.S. PATENT DOCUMENTS

| | | |
|---|---|---|
| 2013/0075148 A1* | 3/2013 | Harvey .................. H05K 1/115 174/266 |
| 2013/0223033 A1 | 8/2013 | Mano et al. |
| 2014/0034373 A1 | 2/2014 | Yoshikawa et al. |
| 2014/0118976 A1 | 5/2014 | Yoshikawa et al. |
| 2014/0293529 A1* | 10/2014 | Nair ...................... H01L 21/568 257/690 |
| 2015/0022985 A1 | 1/2015 | Na et al. |
| 2018/0076161 A1 | 3/2018 | Jain et al. |
| 2019/0198228 A1* | 6/2019 | Vadlamani .......... H01L 23/5383 |

OTHER PUBLICATIONS

Office Action for U.S. Appl. No. 15/855,453, dated May 12, 2021.
Restriction Requirement for U.S. Appl. No. 15/855,453, dated Mar. 4, 2021.
Notice of Allowance for U.S. Appl. No. 15/855,453, dated Oct. 15, 2021.
Office Action for German Patent Application No. 102018129645.2, dated Jan. 23, 2023.

* cited by examiner

METHODS OF EMBEDDING MAGNETIC STRUCTURES IN SUBSTRATES

CLAIM FOR PRIORITY

This application is a divisional of, and claims the benefit of priority to U.S. patent application Ser. No. 15/855,453, filed on Dec. 27, 2017, titled "METHODS OF EMBEDDING MAGNETIC STRUCTURES IN SUBSTRATES", and which is incorporated by reference in its entirety for all purposes.

BACKGROUND

As microelectronic packaging structure design requires ever increasing input out (I/O) density, reduced z-height and reduction in form factor, power delivery requirements become increasingly challenging. Inductor structures have been coupled with such microelectronic packaging structures, such as on backside portions of a package substrate. Magnetic material of such inductor structures can interfere with signal integrity due to conductive fillers present in the magnetic material. Inductor structures can thus exhibit lower efficiency, which can affect power delivery requirements.

BRIEF DESCRIPTION OF THE DRAWINGS

The subject matter described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 3a-3l represent cross sectional views of methods of fabricating package structures, in accordance with some embodiments.

DETAILED DESCRIPTION

Figure 1:
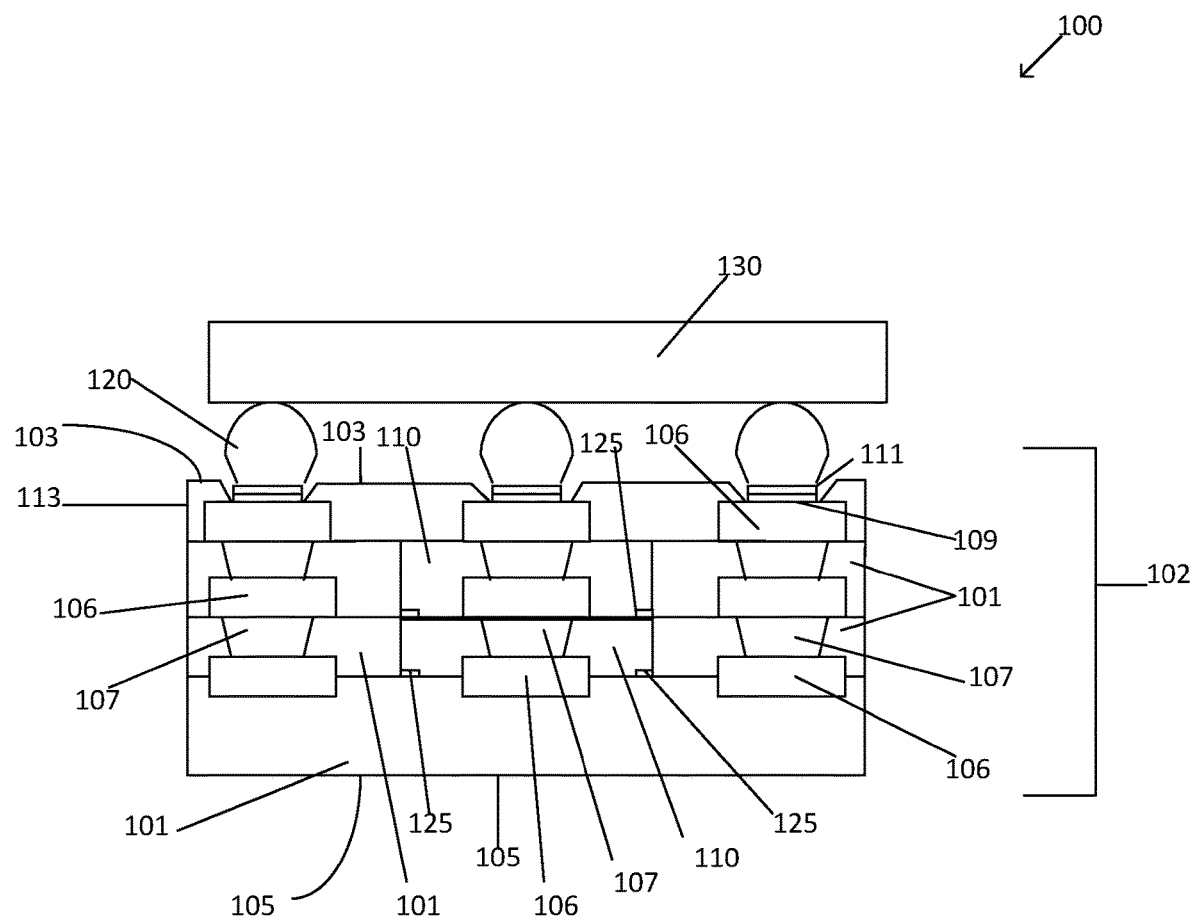
FIG. 1 represents a cross sectional view of a package structure, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials or materials may be directly in contact with the two layers or may have one or more intervening layers.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Embodiments of methods of forming embedded inductor structures comprising selectively located magnetic material, are described herein. In embodiments, the embedded inductor structures may be formed by using magnetic materials and their alloys, that may be selectively formed within particular locations of microelectronic package structures. The selective formation of magnetic material may be incorporated within both cored and coreless packages. The magnetic material of the embedded inductor structures of the embodiments herein may be selectively formed around and disposed on various conductive structures, such as via and pad structures for example.

Methods of forming magnetic material for embedded inductor structure fabrication described herein may include forming a cavity and utilizing stencil printing processing to form a magnetic material, such as a magnetic paste, within selective locations of a package substrate/structure. Other methods may include selectively forming a magnetic paste in desired locations within a package build up layer, and then grinding the dielectric build up material to further pattern an inductor structure. Another embodiment includes utilizing a plasma etching process to pattern the embedded magnetic material.

Various implementations of the embodiments herein may be formed or carried out on a substrate, such as a package substrate. A package substrate may comprise any suitable type of substrate capable of providing electrical communications between a die, such as an integrated circuit (IC) die, and a next-level component to which an microelectronic package may be coupled (e.g., a circuit board). In another embodiment, the substrate may comprise any suitable type of substrate capable of providing electrical communication between an IC die and an upper IC package coupled with a lower IC/die package, and in a further embodiment a substrate may comprise any suitable type of substrate capable of providing electrical communication between an upper IC package and a next-level component to which an IC package is coupled.

FIG. 1 is a cross-sectional view of a package structure 100, wherein the package structure 100 may include a portion of a microelectronic package, and may include an embedded package inductor structure. The embedded inductor structure includes a magnetic material 110, that has been selectively formed, and is embedded within a substrate 102 of the package structure 100, the fabrication process of said embedded inductor to be described further herein. The substrate 102 may comprise a portion of a package substrate 102, in an embodiment. The substrate 102 may comprise a coreless substrate, in an embodiment, and in other embodiments, may comprise a cored substrate. By way of example, in one embodiment, the substrate 102 may comprise a multi-layer substrate—including alternating layers of a dielectric/electrically insulating material 101 and conductive interconnect structures 106, 107, wherein the interconnect structures 107 may comprise a via, in an embodiment, and wherein interconnect structure 106 may comprise a pad, in an embodiment.

The electrically insulating material may comprise such materials as an epoxy laminate, in an embodiment. For example, the substrate 102 may include electrically insulating layers composed of materials such as, phenolic cotton paper materials (e.g., FR-1), cotton paper and epoxy materials (e.g., FR-3), woven glass materials that are laminated together using an epoxy resin (FR-4), glass/paper with epoxy resin (e.g., CEM-1), glass composite with epoxy resin, woven glass cloth with polytetrafluoroethylene (e.g., PTFE CCL), or other polytetrafluoroethylene-based prepreg material.

Other types of substrates and substrate materials may also find use with the disclosed embodiments (e.g., ceramics, sapphire, glass, etc.). Further, according to one embodiment, a substrate may comprise alternating layers of dielectric material and metal that are built-up over a die itself—this process is sometimes referred to as a "bumpless build-up process." Where such an approach is utilized, conductive interconnects may or may not be needed (as the build-up layers may be disposed directly over a die, in some cases).

The substrate 102 may provide structural support for a die/device, such as device 130, for example. Solder structures 120 may be disposed on a first surface 103 and/or a second surface 105 of the substrate 102, and may be disposed adjacent a solder resist material 113, in an embodiment. The solder structures 120 may be electrically coupled to the die 130 and/or a PCB/motherboard, in an embodiment. In an embodiment, the die 130, may be electrically and physically coupled to the package substrate 102 through the solder structures 120.

The die/device 130 may comprise any type of integrated circuit device. In one embodiment, the die 130 may include a processing system (either single core or multi-core). For example, the die 130 may comprise a microprocessor, a graphics processor, a signal processor, a network processor, a chipset, etc. In one embodiment, the die 130 may comprise a system-on-chip (SoC) having multiple functional units (e.g., one or more processing units, one or more graphics units, one or more communications units, one or more signal processing units, one or more security units, etc.). However, it should be understood that the disclosed embodiments are not limited to any particular type or class of devices/die. In an embodiment, the substrate may comprise any number of die coupled thereto.

Conductive interconnect structures may be disposed on a side(s) of the die/device 130 (not shown) and may comprise any type of structure and materials capable of providing electrical communication between a die/device and a substrate, or another die/device, for example. In an embodiment, conductive interconnect structures may comprise an electrically conductive terminal on a die (e.g., a pad, bump, stud bump, column, pillar, or other suitable structure or combination of structures) and a corresponding electrically conductive terminal on a substrate (e.g., a pad, bump, stud bump, column, pillar, or other suitable structure or combination of structures). Solder structures 120 (e.g., in the form of balls or bumps) may be disposed on the terminals 109 of the substrate 102 and/or die/device, and these terminals may then be joined using a solder reflow process. Of course, it should be understood that many other types of interconnects and materials are possible (e.g., wirebonds extending between a die and a substrate).

The terminals on the die 130 may comprise any suitable material or any suitable combination of materials, whether disposed in multiple layers or combined to form one or more alloys and/or one or more intermetallic compounds. For example, the terminals on the die may include copper, aluminum, gold, silver, nickel, titanium, tungsten, as well as any combination of these and/or other metals. In other embodiments, a terminal may comprise one or more non-metallic materials (e.g., a conductive polymer). The terminals 109 on a surface of the substrate 102 may also comprise any suitable material or any suitable combination of materials, whether disposed in multiple layers or combined to form one or more alloys and/or one or more intermetallic compounds. A surface finish 111, may be disposed on terminals/copper pads 109 on a surface of conductive structure 106, in an embodiment, wherein the surface finish 111 may comprise such materials as an electroplated nickel/gold (ENIG) finish, and other similar finish materials.

The conductive interconnect structures 106, 107 may be disposed within dielectric portions 101 of the substrate 102 in any pattern as required by the particular application, according to embodiments. Any number of build-up layers may be disposed within the substrate 102, wherein the conductive interconnect structures 106, 107 may comprise via structures, such as microvias, for example within build up layers. The substrate 102 may comprise any number of dielectric layers 101, which may include any number of conductive interconnect structures 106, 107 as appropriate for a particular application. Individual ones of the conductive interconnect structures 106, 107 may comprise traces, trenches, routing layers, ground planes, power planes, re-distribution layers (RDLs), and/or any other appropriate electrical routing features. Although specific patterns of the conductive interconnect structures 106, 107 are illustrated in FIG. 1, such patterns are merely exemplary, and may vary according to the particular application.

The magnetic material 110 may comprise a portion of an embedded inductor structure, wherein conductive material may be patterned around the magnetic material to form embedded inductor structures of any desired geometry, which will be described further herein. In an embodiment, the magnetic material 110 incorporated in the embedded inductor structure may comprise at least a portion of a power distribution system that may supply power to the die 130 and/or to other components, devices, or systems coupled to the substrate 102/package structure 100. For example, an embedded magnetic inductor incorporating the magnetic material 110 may form a portion of a voltage regulator coupled to a power supply for the die 130. Integrating the embedded magnetic inductor structures into the semiconductor substrate 102 may eliminate the need for an external inductor.

The magnetic material 110, may comprise a magnetic film, and in other embodiments, may comprise a magnetic paste and/or a magnetic ink. The magnetic material 110 may include one or more metallic magnetic materials or one or more soft ferrite magnetic materials. Example metallic magnetic materials include, but are not limited to: iron (Fe); oriented iron silicide (FeSi); unoriented iron silicide (FeSi); iron-nickel (FeNi) and iron nickel containing alloys; iron-cobalt (FeCo) and iron-cobalt containing alloys; FeSiBNbCu and FeSiBNbCu containing alloys; and CoZrTa and CoZrTa containing alloys. Example soft ferrite magnetic materials include, but are not limited to: manganese-zinc ferrite (MnZn); nickel-zinc ferrite (NiZn); and ferric oxide ($Fe_2O_3$).

Soft ferrites have a relatively low coercivity which permits the magnetic field produced by a soft ferrite to easily reverse without hysteresis losses (i.e., energy dissipation). The relatively low losses of soft ferrite materials at high frequencies provides an advantage in both radio frequency (RF) applications and switched-mode power supplies. In an embodiment, the magnetic paste and/or magnetic ink may comprise a carrier material, which may comprise one or more of thermosetting resins, such as epoxies; inter-penetrating polymer networks; liquid crystalline polymers (LCP); fluoropolymers, such as polytetrafluoroethylene (PTFE); and silicones.

In one embodiment, the carrier that may be included in the magnetic material 110 may include bis-benzocyclobutene (BCB, for example bis-benzocyclobutene offered under the commercial name CYCLOTENE™ 3022 by Dow Chemical Co., MIDLAND, MI). In some embodiments, a liquid crystalline polymer may include one or more polymers dissolved in one or more solvents (e.g., lyotropic liquid-crystal polymers). In some embodiments, a liquid crystalline polymer may include one or more polymers or polymer mixtures heated above its glass or melting transition point (e.g., thermotropic liquid-crystal polymers). The magnetic material 110 may be applied, deposited, or otherwise formed using any number and/or combination of currently available and/or future developed liquid application techniques including spray deposition, spin coating, printing, and similar.

In an embodiment, the magnetic material 110 may be disposed on surfaces, and in some embodiment, directly disposed on surfaces of the interconnect structures 106, 107. For example, a magnetic material 110 may be disposed on conductive structures 106, 107, and may be embedded within the substrate 102, and may be disposed on the dielectric material 101 of the package substrate 102, and may not be disposed on the first surfaces 103, nor on the second surface 105 of the substrate 102. That is, the magnetic material 110 may be completely embedded within the substrate 102. The magnetic material 110 may comprise a selectively formed magnetic material, which may be formed according to particular design requirements in any suitable location/locations within the substrate 102, as will be further described herein.

In some embodiments, the magnetic material 110 may be formed on a conductive seed layer (not shown), such as on a copper seed layer, for example. The seed layer may be disposed between the conductive interconnect structures 106, 107 and the magnetic material 110, in an embodiment. The seed layer may comprise a thickness of about 50 nm to about 5 microns, and may be formed by an electroplating process, in an embodiment. In other embodiments, the seed layer may be formed by any suitable formation process, such as by a physical vapor deposition process, for example. The seed layer may comprise such materials as copper, titanium and/or nickel, for example. The magnetic material 110 may comprise such materials as iron, nickel, cobalt, molybdenum, and combinations thereof, in an embodiment.

The magnetic material 110 may comprise magnetic materials possessing a high permeability and a low coercivity, and may comprise those materials that are suitable for use as an efficient in-package/embedded inductor, to be described further herein. In some embodiments, the magnetic material 110 may comprise a permeability of between about 2 and about 50, and in other embodiments, the permeability may be greater than about 2. In some embodiments, the magnetic material 110 may comprise a thickness of between about 10 microns to about 1000 microns, but in other embodiments the magnetic material 110 thickness may vary according to the particular application. In an embodiment, the magnetic material 110 may optionally include conductive structures, such as rectangular copper structures 125 disposed within the magnetic material 110 and adjacent the dielectric material 101.

Figure 2A:
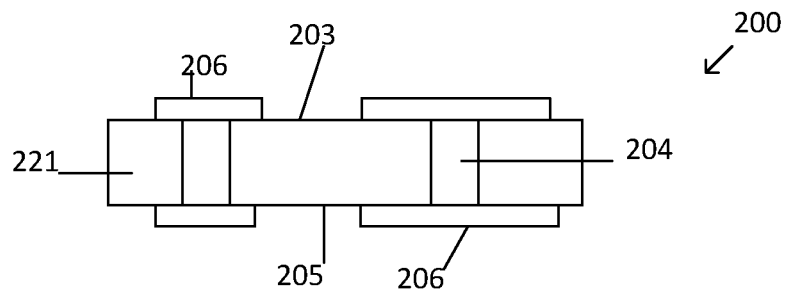
FIGS. 2a-2l represent cross sectional views of methods of fabricating package structures, in accordance with some embodiments.

FIGS. 2a-2m depict embodiments of forming an embedded magnetic inductor structure, wherein the magnetic material may be formed in a cavity within a dielectric material, for example. FIG. 2a depicts a cross sectional view of a portion of a package structure 200, wherein a core 221, may comprise conductive interconnect structures, such as pads 206 disposed on surfaces, such as a first surface 203, and on a second surface 205 of the core 221. A plated through hole 204, may extend through the core 221, in an embodiment. The core 221 may comprise an organic core, in an embodiment, and may comprise any suitable organic materials, in an embodiment, and may comprise other suitable materials, such as ceramic and/or glass.

In other embodiments, the package structure 200 may comprise a coreless package structure 200. In an embodiment, build up layers may subsequently be formed on the surfaces 203, 205 of the core. The package structure 200 may be a portion of a PCB, an interposer, or the like. In some exemplary embodiments, the package structure 200 may comprise a PCB in a multi-level board including a plurality of conductive trace levels laminated with glass-reinforced epoxy sheets (e.g., FR-4).

Figure 2B:
Figure 2B:
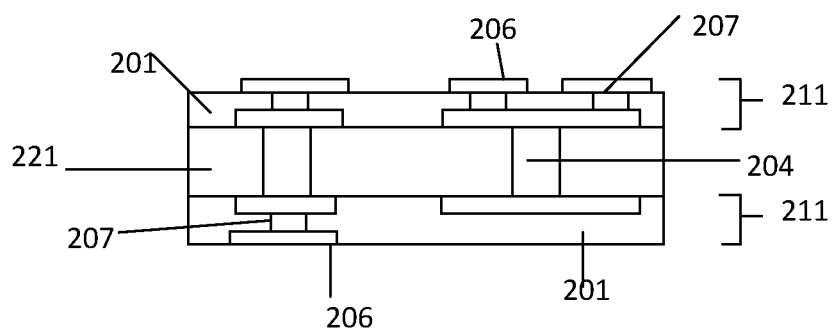
Figure 2C:
Figure 2C:
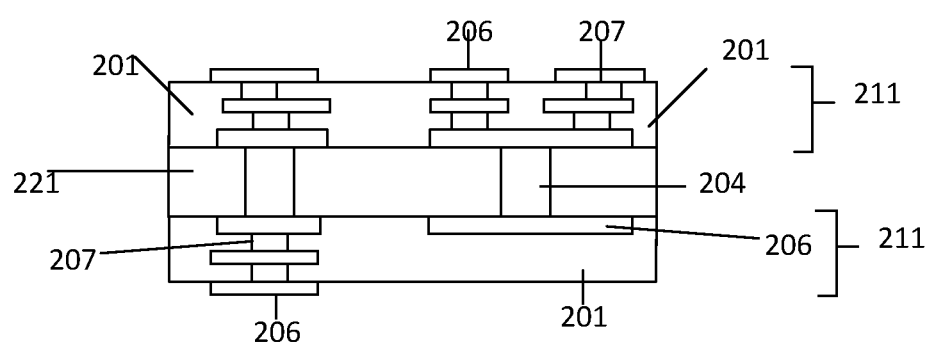

In FIGS. 2b-2c, build up layers 211 may be formed on the surfaces 203, 205 of the core 221, to build up a substrate 202 such as a package substrate 202, for example. The substrate 202 may comprise any number of build up layers comprising conductive layers and dielectric layers. In an embodiment, the build up layers 211 may be formed by laminating and patterning a dielectric material, such as any suitable build up dielectric material for example, and forming and patterning a conductive material, such as a copper material for example, to form conductive traces within the dielectric material. Interconnect structures 206, 207 comprising conductive material may be formed within the dielectric material 201. In an embodiment, the interconnect structures 206 may comprise pads, and the interconnect structures 207 may comprise vias. In an embodiment, a dry film resist (DFR) patterning process may be utilized to form the conductive structures 206, 207, in an embodiment.

Figure 2D:
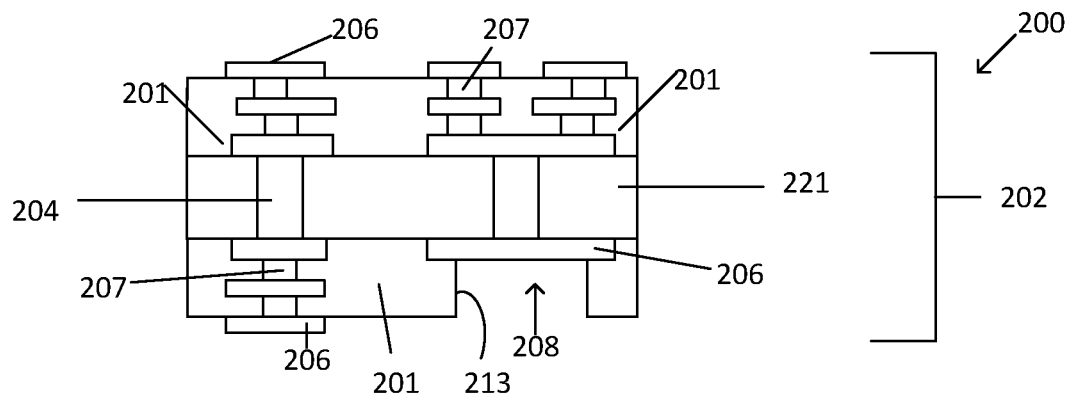

In FIG. 2d, an opening 208 may be formed within the dielectric material 201, wherein a surface of a conductive interconnect structure, such as the conductive interconnect structure 206, may be exposed. The opening 208 may be formed utilizing a laser drilling and de-smear processing, in an embodiment. The opening 208 may be formed in locations where an embedded package inductor is to be formed within the substrate 202, such that an embedded inductor may be selectively formed within a package substrate. The opening 208 may comprise a rectangular structure, and may comprise linear sidewalls 213, in an embodiment.

In an embodiment, a seed layer (not shown) may optionally be formed on the conductive structure 206, and on the sidewalls of the opening 208. The seed layer may comprise a thickness of about 50 nm to about 5 microns, in an embodiment, and may be formed by an electroplating process, in an embodiment. In other embodiments, the seed layer may be formed by any suitable formation process, such as by a physical vapor deposition process, for example. The seed layer may comprise such materials as copper, titanium and nickel, for example.

Figure 2E:
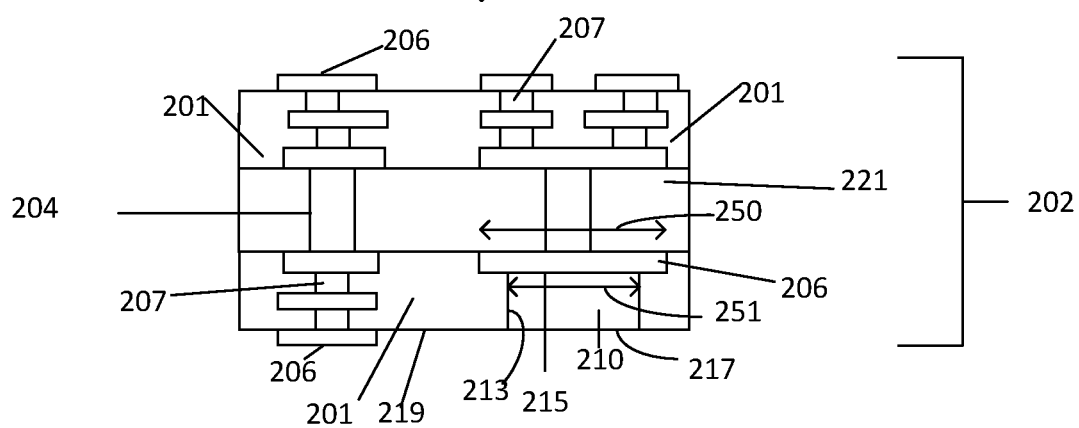

In FIG. 2e, a magnetic material 210 may be formed in the opening 208, wherein the magnetic material 210 may comprise a magnetic paste and/or a magnetic ink, and may comprise similar properties to the magnetic material of FIG. 1. In an embodiment, the magnetic material 210 may be formed on the sidewalls 213 of the opening and on the exposed surface of the conductive interconnect structure 206, by utilizing a stencil printing process. The magnetic material 210 is formed such that the magnetic material 210 may comprise a first side 215 and a second side 217, wherein the second side 217 of the magnetic material is coplanar (within about 1-2 degrees) with an adjacent surface 219 of the dielectric material 201. In an embodiment, a length 251 of at least one of the first side 215 or the second side 217 of the magnetic material 210 may be less than about 2 times a length 250 of the interconnect structure 206, and may be less than about 1.5 times a length 250 of the interconnect structure 250. In other embodiments, a length of one of the first side 215 or the second side 217 may be less than a length of the interconnect structure 206.

By utilizing stencil printing techniques, the magnetic material 210 may be selectively formed within portions/locations of the package substrate 202, according to particular design requirements, wherein in-package/embedded inductor structures are desired to be located. Any number of openings and magnetic materials may be placed in selected locations within the substrate.

Figure 2F:
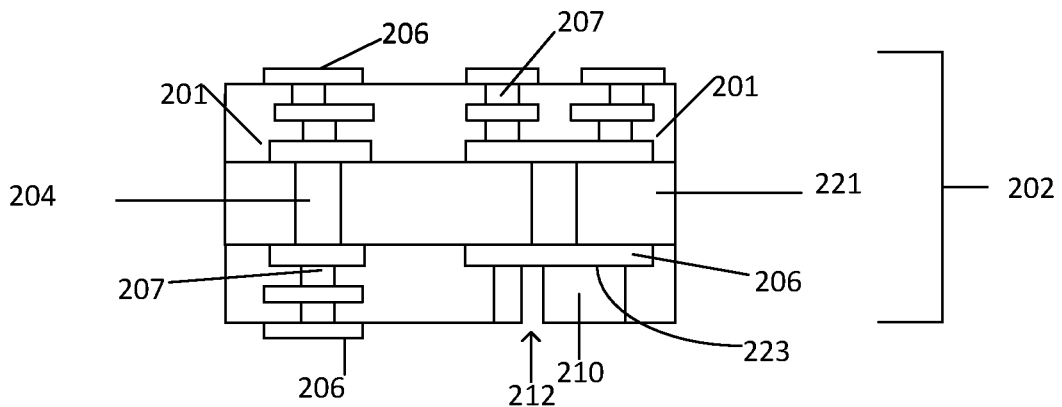
Figure 2G:
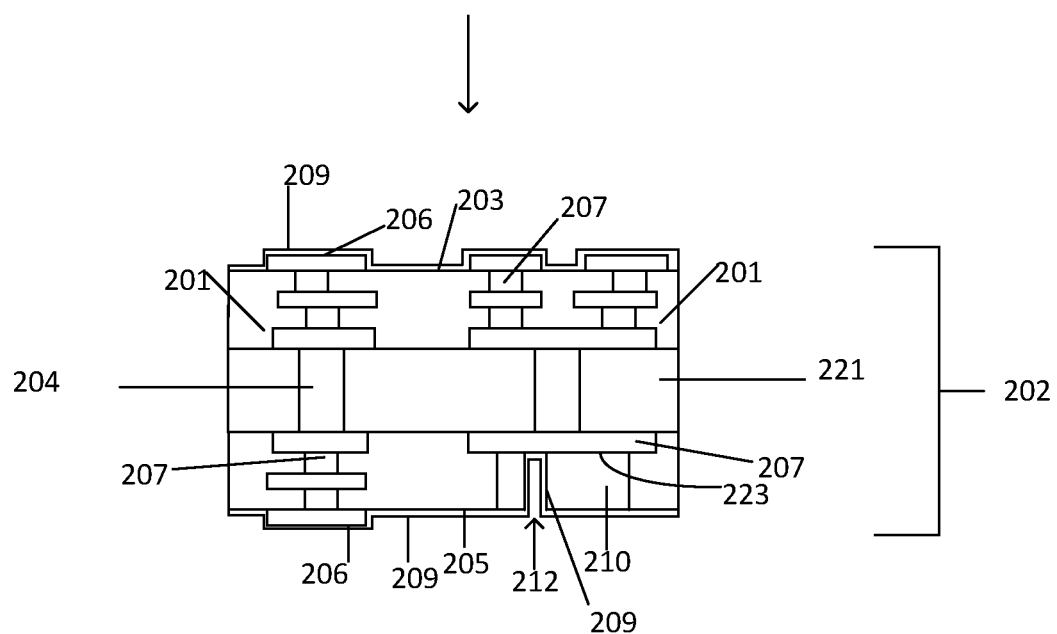
Figure 2H:
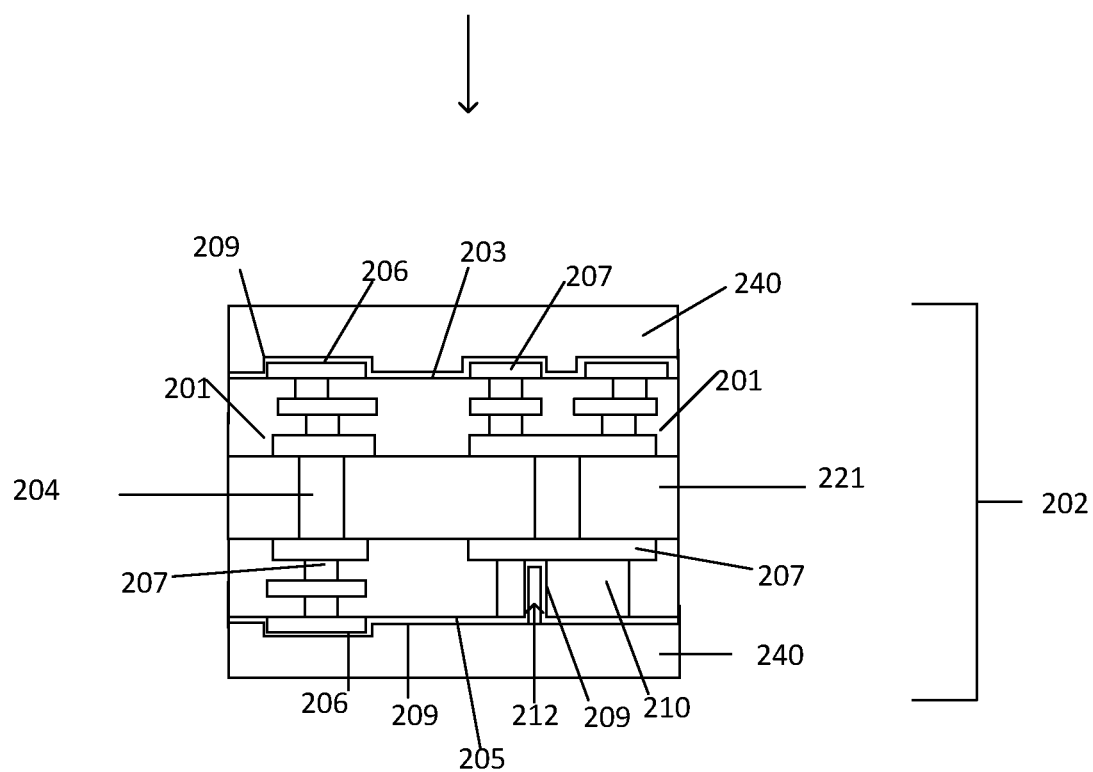

Subsequent to the formation of the magnetic material 210 in the opening 208, a magnetic opening 212 may be formed in the magnetic material 210 itself (FIG. 2f). The magnetic opening 212 may expose a surface 223, such as a first surface, of the conductive interconnect structure 206, that is disposed at least partially on the first side 215 of the magnetic material 210. The magnetic opening 212 may comprise linear sidewalls, in an embodiment. A seed layer 209, such as a copper electroplated seed layer, for example, may be formed on the first side 203 and the second side 205 of the substrate 202, and may be formed within the magnetic opening 212 and on a portion of the surface 223 of the conductive interconnect structure 206 (FIG. 2g). Sidewalls of the magnetic opening 212 may be lined with the seed layer 209, but the seed layer 209 does not completely fill the opening 208. The seed layer 209 may comprise a thickness of between about 50 nm to about 5 microns, in an embodiment.

Figure 2I:
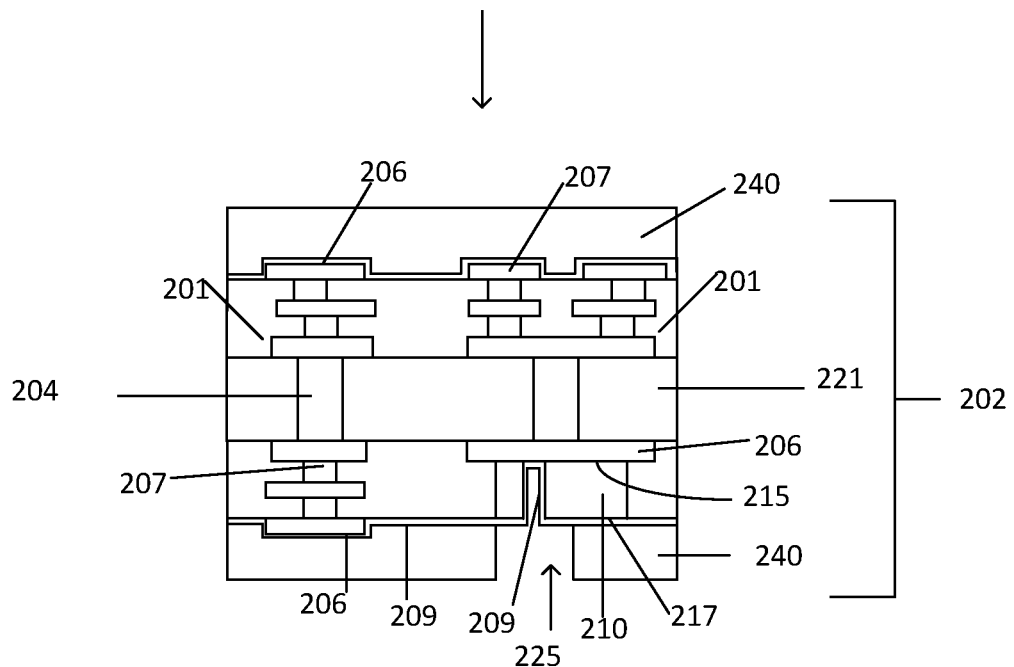
Figure 2J:
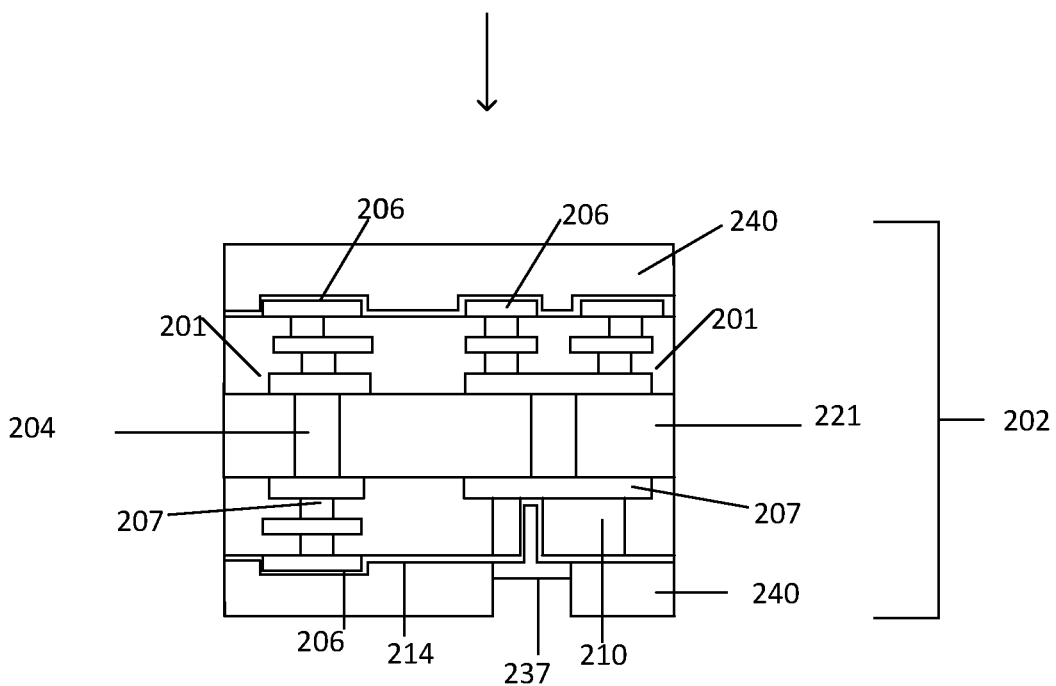
Figure 2K:
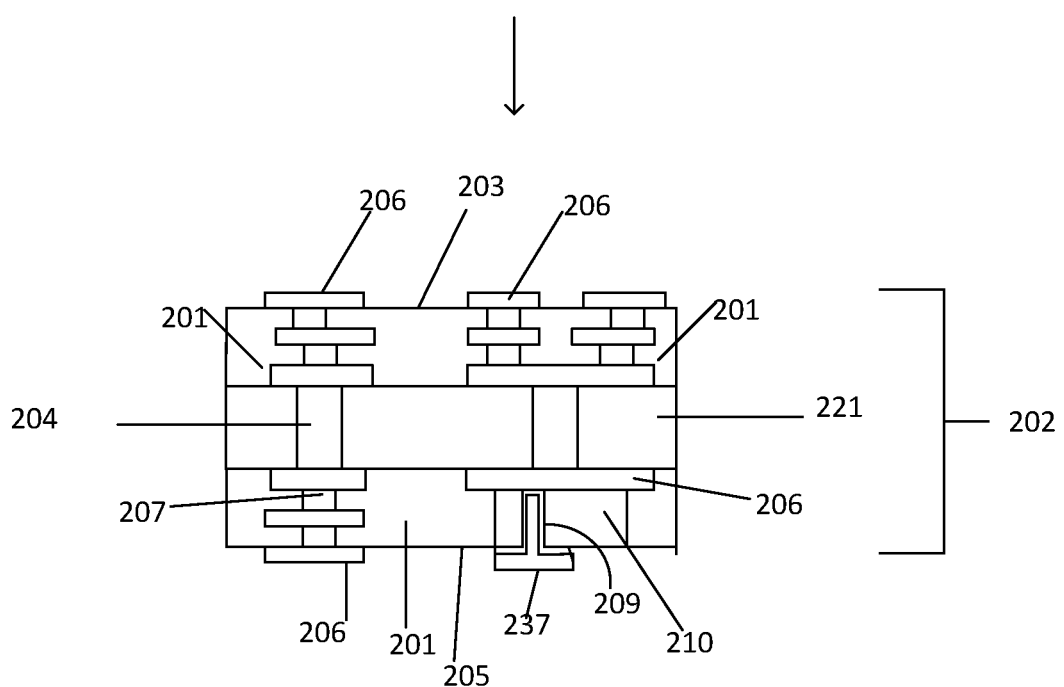

A patterning material 240, such as a dry film resist, for example, may be formed/laminated onto the first and second sides 203, 205 of the substrate 202 (FIG. 2h), and an opening 225 may be formed in the patterning material 240 (FIG. 2i). The opening 225 may expose a portion of the seed layer 209 that is disposed within the magnetic opening 212, and may expose a portion of the seed layer 209 that is disposed on the second side 217 of the magnetic material 210. A conductive trace/interconnect structure 237 may be formed on the seed layer 209 (FIG. 2j), within the magnetic opening and also on the exposed portion of the seed layer 209 on the second side 217 of the magnetic material 210. The conductive interconnect structure 237 may comprise any shape according to the particular design requirements, but is dependent on the size of the magnetic opening 212 and the seed layer 209 location. In an embodiment, a first side of the interconnect structure 237 may be disposed on the first side of the interconnect structure 206, and a second side of the second interconnect structure, opposite the first side of the interconnect structure 237, may be coplanar with the second side of the magnetic material.

Figure 2L:
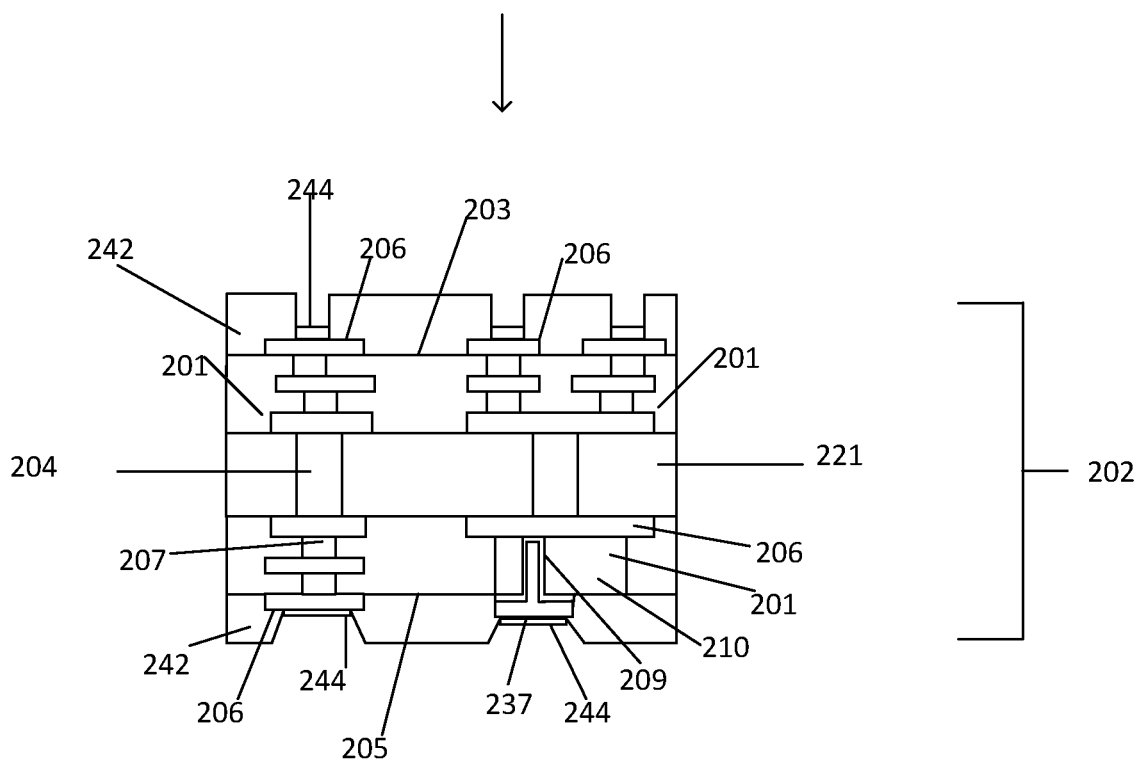
Figure 2M:
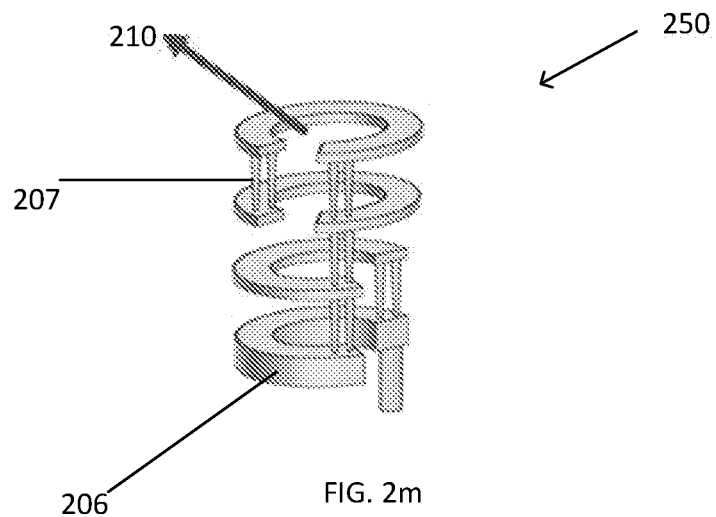
FIG. 2m represents a side perspective view of an inductor structure according to embodiments.

The patterning material 240 may be removed from the substrate 202 (FIG. 2k), and the remaining seed layer 209 may be removed from the first and second sides 203, 205 of the substrate 202 by utilizing a flash etch process, in an embodiment. In FIG. 2l, solder resist 242 may be formed on the first and second sides 203, 205 of the substrate 202, and openings may be patterned to reveal/expose the conductive structures 206 and to reveal the conductive structure 137. Pads 244, such as copper pads, may be formed on the conductive structures 206, 237, and solder interconnect structures, such as solder balls may be formed on the pads 244. A device, such as the device 130 of FIG. 1, for example, or a board (not shown), such as a motherboard for example, may be coupled with the first side 203 or the second side 205 of the substrate 202 by via solder structures coupled to the pads 244.

Although FIGS. 2a-2l depict the formation of the magnetic material on a core of a cored substrate, a stencil process may be employed to form an embedded inductor structure in a prepeg-based substrate, such as in an interposer, for example. The stencil process described herein may also be employed with a coreless substrate, wherein two coreless panels may be attached to either side of a temporary core, and cavities may be drilled into both panels above and below the temporary core (not shown). A magnetic material may be drilled and plated on both sides of such as temporary core while the temporary core protects the front sides of each substrate.

Figure 2N:
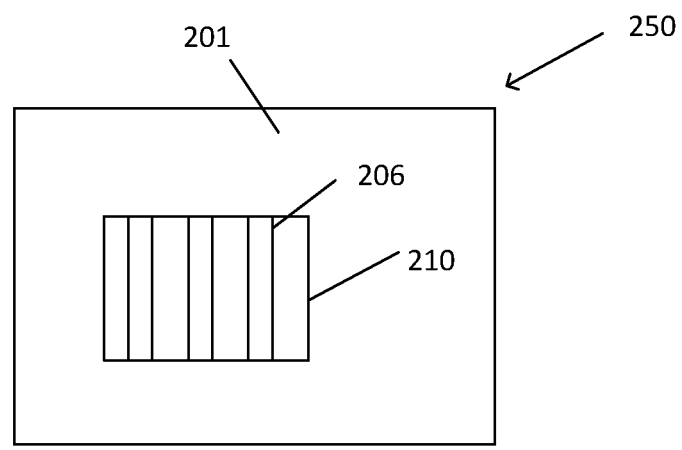
FIG. 2n represents a top view of an inductor structure according to embodiments.

The magnetic material 210 disposed on the conductive structures may comprise any suitable geometric structure, depending upon the particular design requirements for an embedded inductor. For example, an inductor 250 geometry may comprise a serpentine structure (FIG. 2m, side perspective view) wherein conductive structures 206, 207 are disposed on the selectively formed magnetic material 210, in an embodiment. In another embodiment, an inductor 250 geometry may comprise a conductive material 206 that may be disposed in a rectangular shape on the selectively formed magnetic material, adjacent the dielectric material 201 within the substrate FIG. 2n (top view).

Figure 3A:
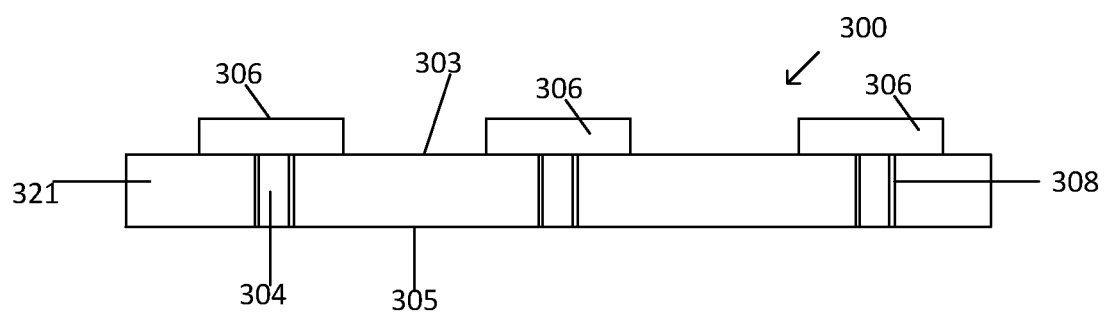
Figure 3B:
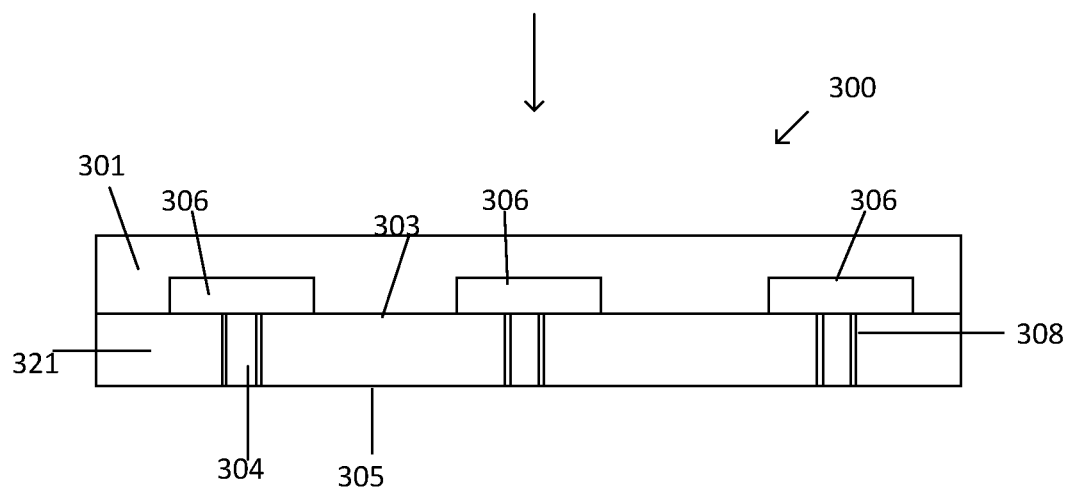

In another embodiment, a magnetic material may be selectively formed within portions of a substrate by utilizing a grinding process with which to reveal a magnetic material, such as a magnetic paste and/or a magnetic ink, for example (FIGS. 3a-3l). In FIG. 3a, a cross sectional view of a portion of a package structure 300, is depicted, wherein a core 321 may comprise conductive interconnect structures, such as pads 306 disposed on surfaces, such as a first surface 303, and on a second surface 305 of the core 321. A plated through hole 304, may extend through the core 321, in an embodiment. The plated through holes 304 may be plated on sidewalls with a conductive layer 305, which may comprise a copper layer 305. The core 321 may comprise an organic core, in an embodiment, and may comprise any suitable organic materials, in an embodiment, and may comprise other suitable materials, such as ceramic and/or glass.

Figure 3C:
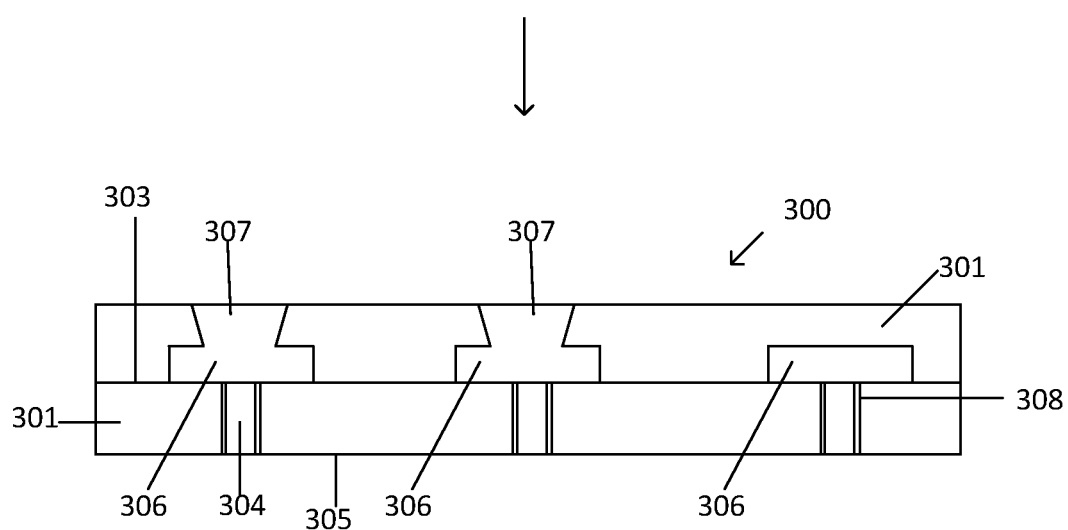
Figure 3D:
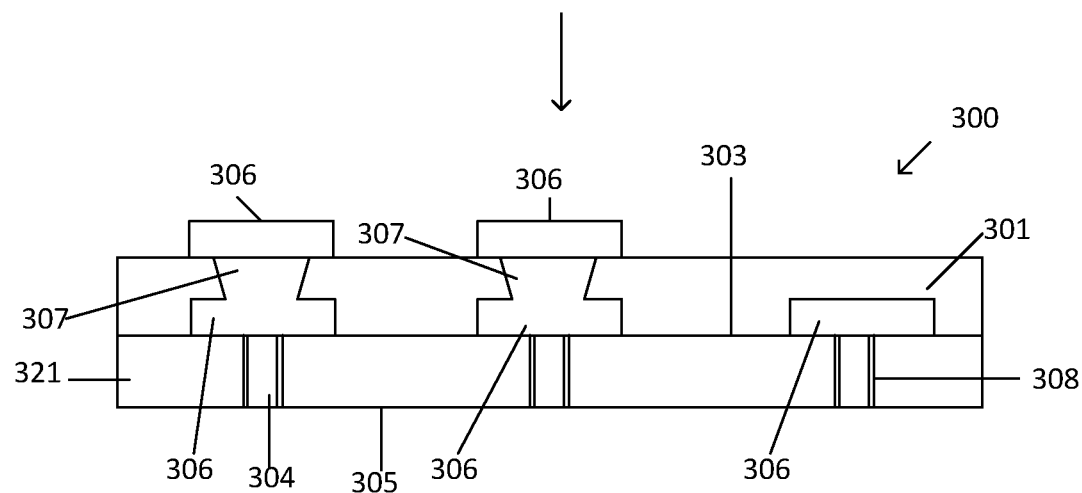
Figure 3E:
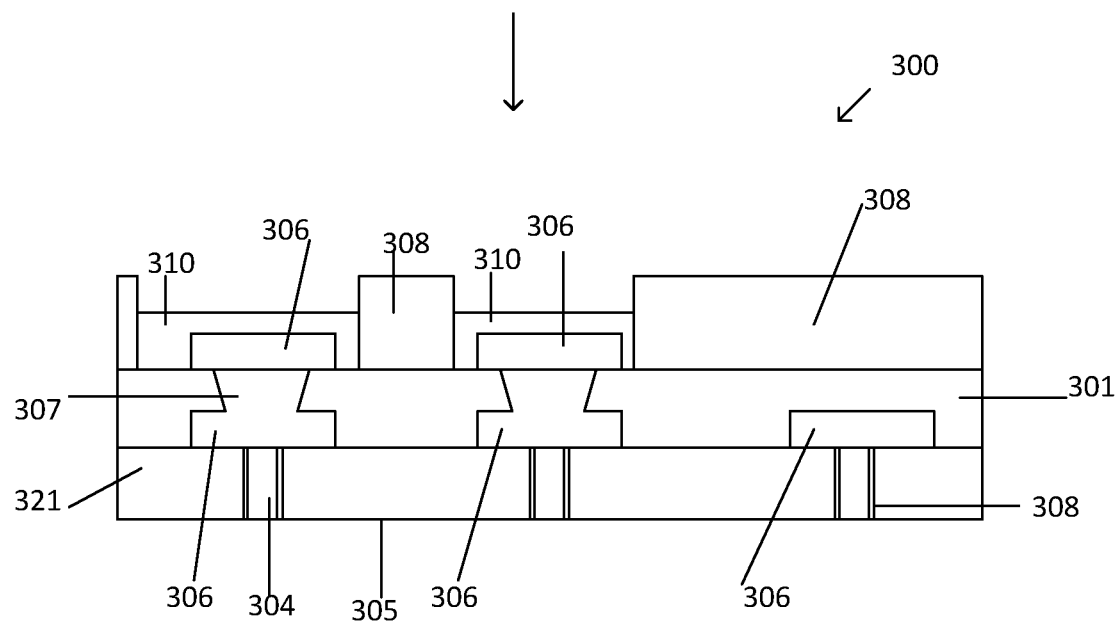
Figure 3F:
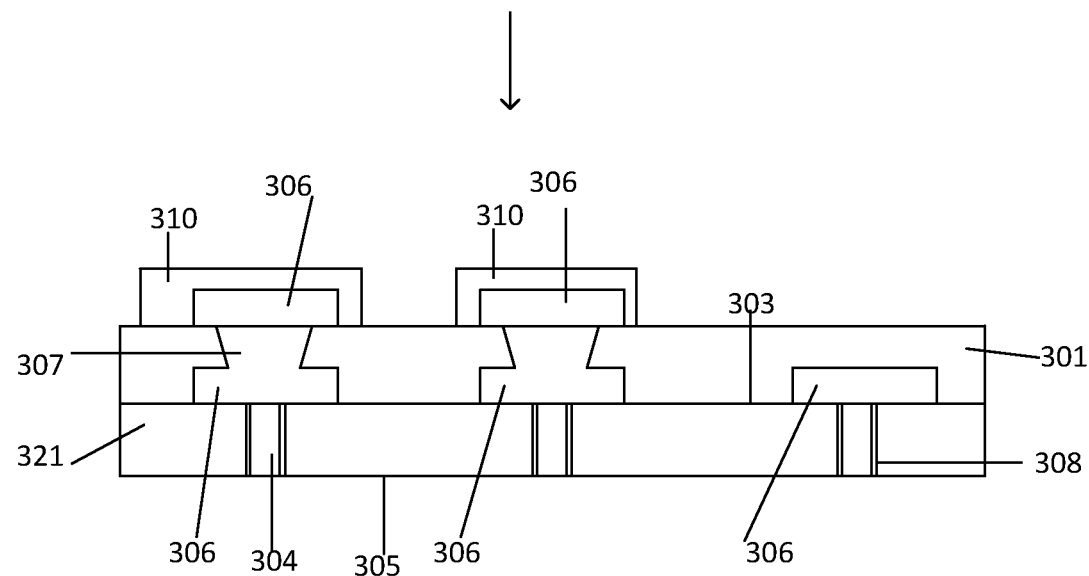

In other embodiments, the package structure 300 may comprise a coreless package structure 300. In an embodiment, a dielectric material 301 may be formed/laminated onto the first side and the second side of the core 321 (FIG. 3b), and conductive structures 307, such as conductive via structures 307 may be formed within the dielectric material by utilizing plating and drilling process, for example (FIG. 3c). Conductive pads 306 may be formed on the conductive vias 307 (FIG. 3d).

A patterning material 308, such as a dry film resist for example, may be formed on the dielectric material 301 (FIG. 3e), and a magnetic material 310 may be formed on the conductive interconnect structure 306, between the patterning material 308. In an embodiment, the magnetic material may be selectively formed wherein a sidewall of the magnetic material may be formed adjacent a sidewall of the first conductive via 307.

Figure 3G:
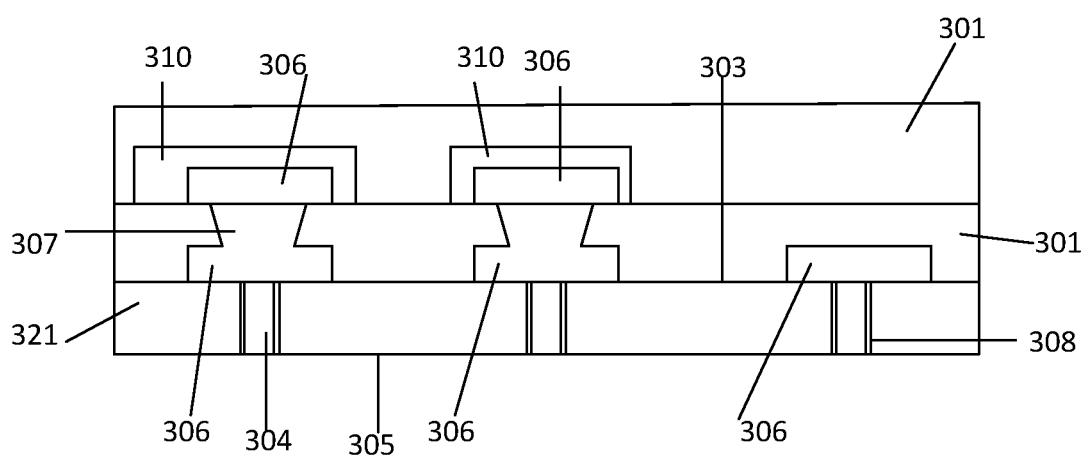
Figure 3H:
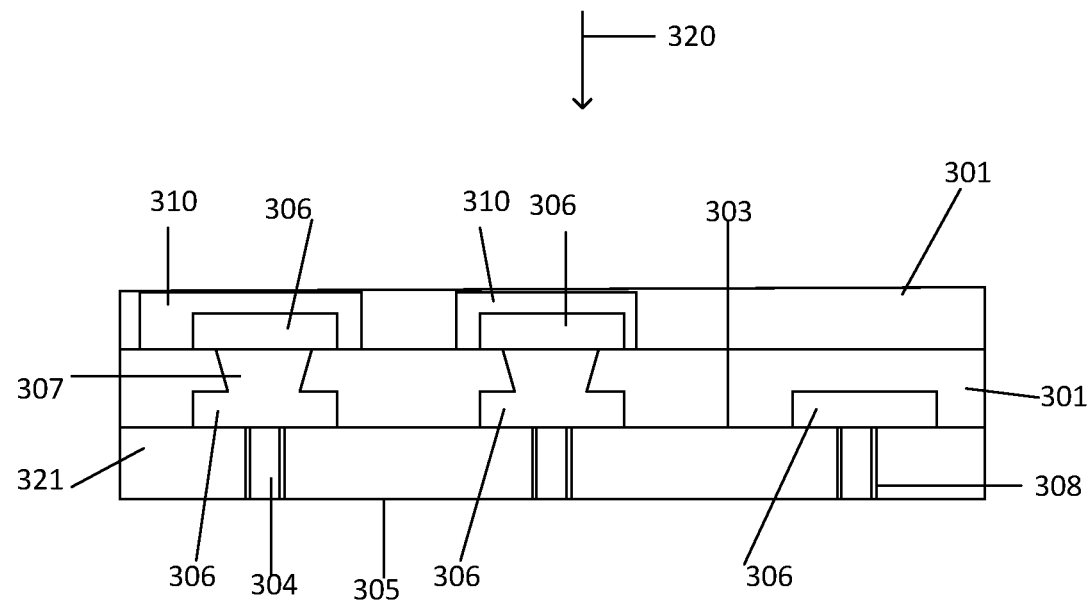

The magnetic material 310 may comprise a magnetic paste or a magnetic ink, and may comprise one or more of the magnetic materials described in FIG. 1, for example. The patterning material 310 may be removed (FIG. 3f), and a dielectric layer 301 may be formed/laminated over the magnetic material 310 (FIG. 3g). A planarizing process 320, such as a grinding process 320, may be performed wherein the dielectric layer 301 and the magnetic material 310 may be coplanar (FIG. 3h).

Figure 3I:
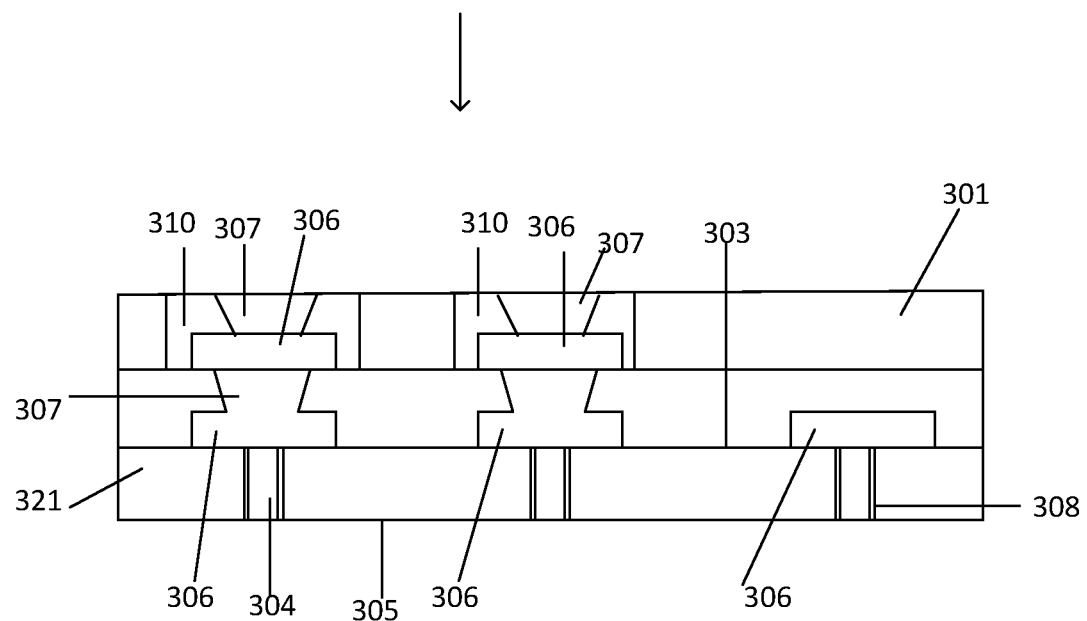
Figure 3J:
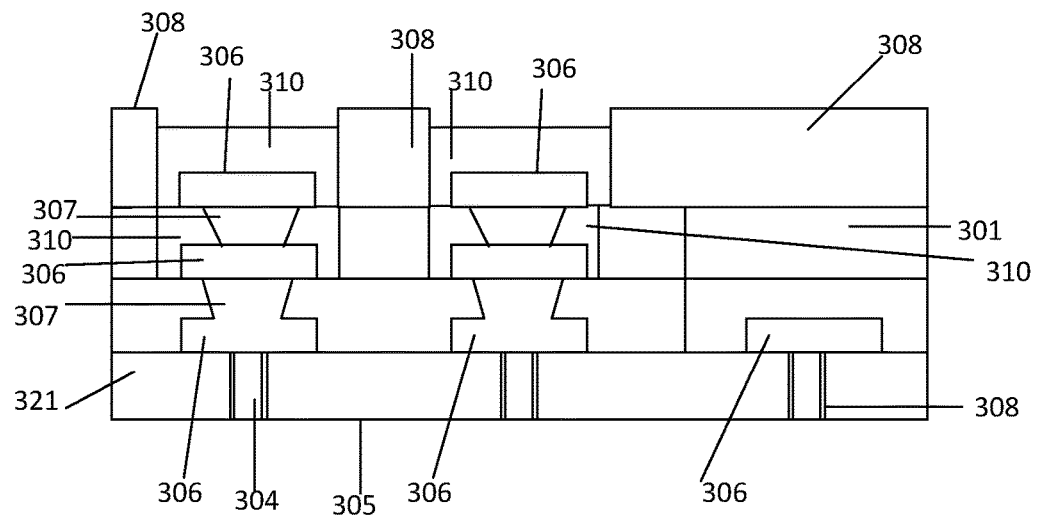
Figure 3K:
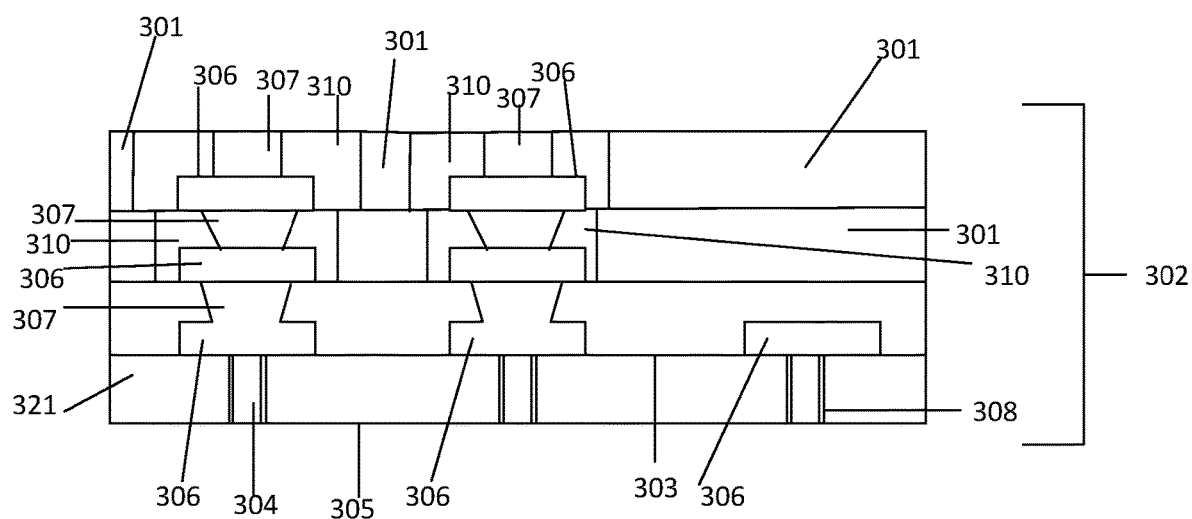
Figure 3I:
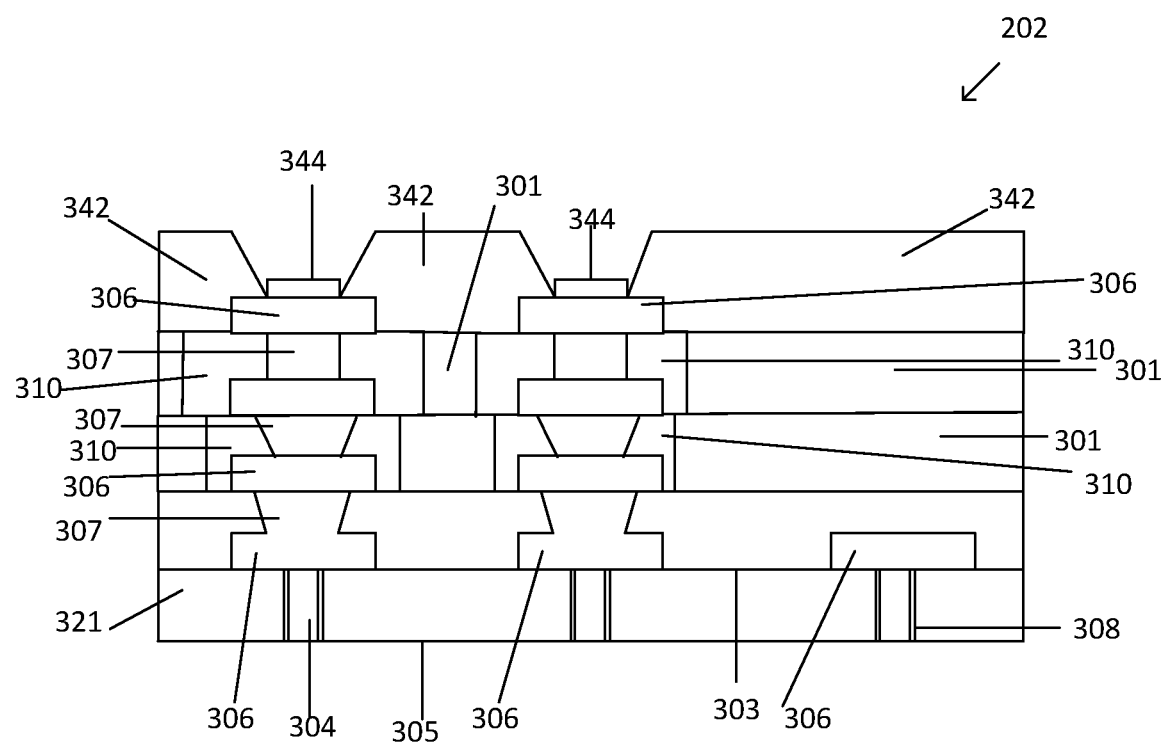

Conductive structures 307 may be formed in the magnetic material 310, utilizing laser drilling and copper plating processes, for example (FIG. 3i). Conductive structures 306, such as conductive pads, may be formed on the conductive structures 307, patterning material may be placed in desired locations adjacent the conductive pads, and additional magnetic material 310 may be formed on the conductive pads 306 between the patterning material 308 (FIG. 3j). Conductive structures 307 may be formed within the magnetic material 310 (FIG. 3k). The process of forming magnetic material 310 within the substrate 302 and revealing the magnetic material 310 by utilizing a grinding process may be repeated for as many desired locations for inductor placement within the substrate 302. In an embodiment, a solder resist material 342 may be placed on the final build up layer of the substrate 302, and pads 344 may be formed on conductive interconnect structures 306 (FIG. 3l). Solder structures (not shown) may be formed on the pads, wherein the solder structures may be coupled to a board or a device. Inductor structures may comprise any suitable geometries, and may include structures such as those depicted in FIGS. 2m-2n, for example.

Figure 4A:
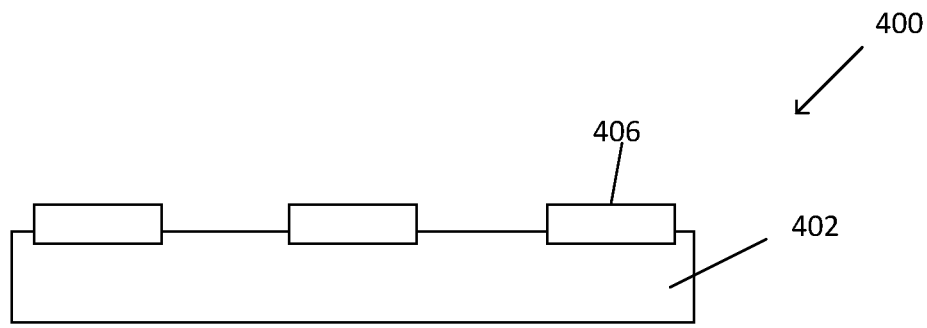
FIGS. 4a-4o cross sectional views of methods of fabricating package structures, in accordance with some embodiments.
Figure 4B:
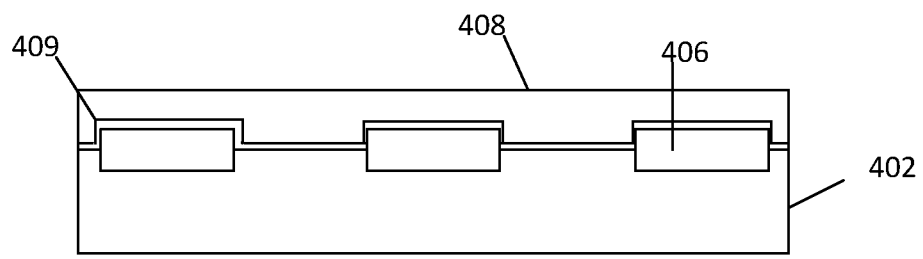
Figure 4C:
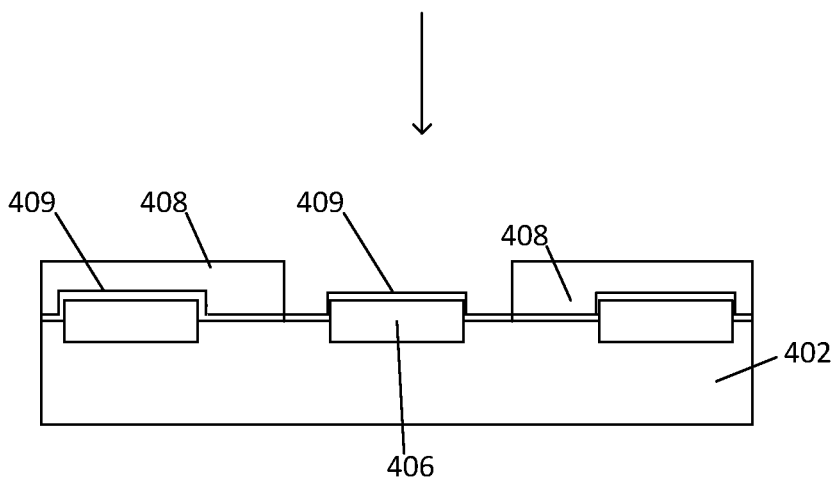
Figure 4D:
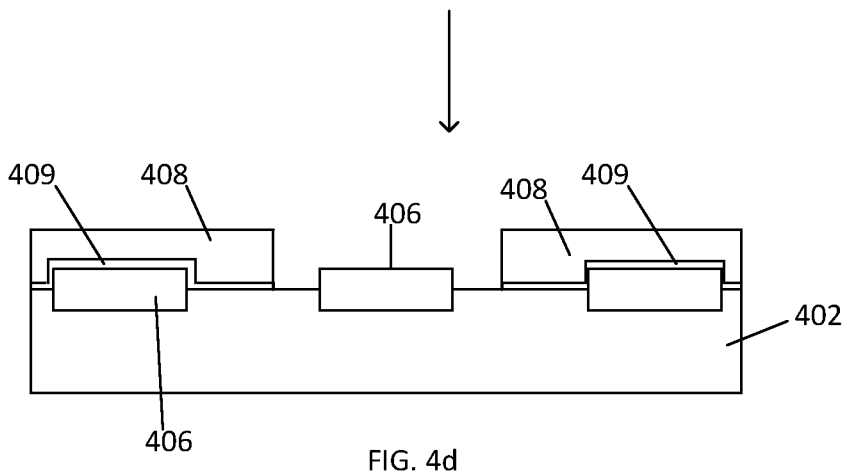
Figure 4E:
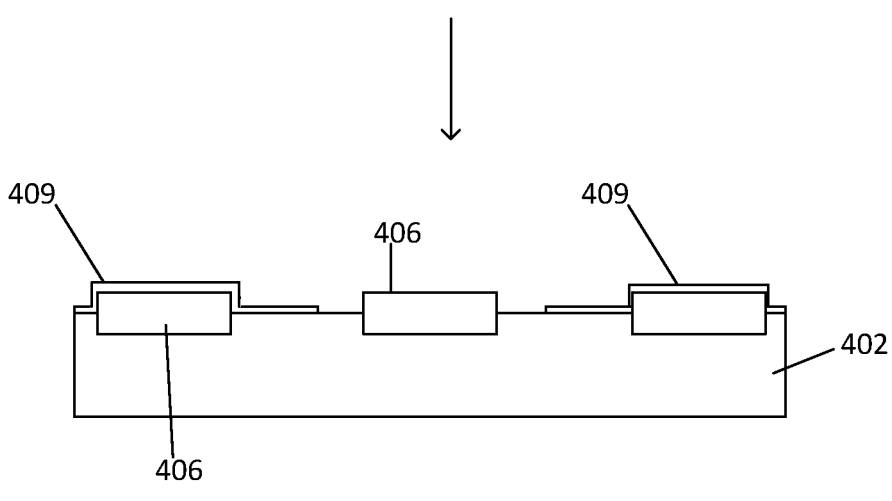

In yet another embodiment, the magnetic material of the embodiments herein may be formed within a substrate, such as a package substrate, by using a plasma etch process. A substrate 400, such as a package substrate, may comprise conductive structures 406 disposed thereon. A conductive layer 409, such as an electroless copper layer 409, may be formed on the conductive structures 406 and on the substrate 402 (FIG. 4b). The conductive layer 409 may comprise a thickness between about 50 nm to about 5 microns, in an embodiment. A patterning material 408 may be formed on the conductive layer 409, and may be patterned (FIG. 4c). An exposed portion of the conductive layer 409 may be removed from the substrate and from an exposed conductive structure 406 by using a flash etch process, for example (FIG. 4d), and the patterning material 408 may then be removed (FIG. 4e).

Figure 4F:
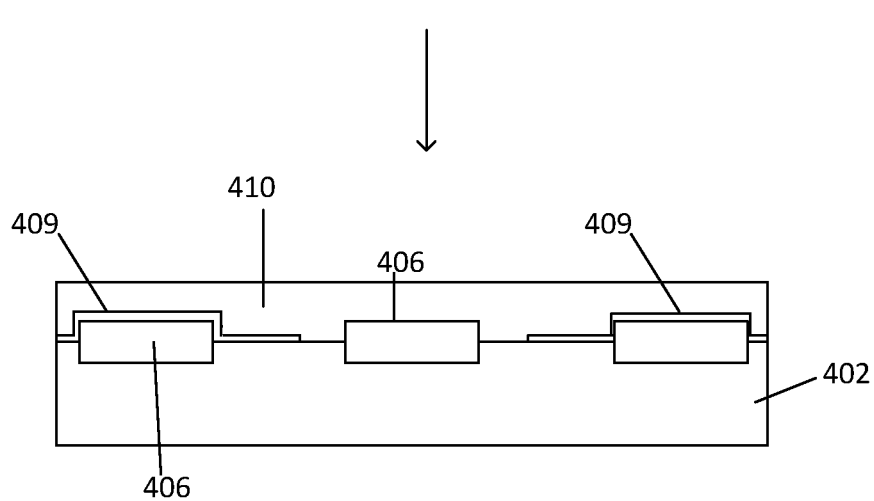
Figure 4G:
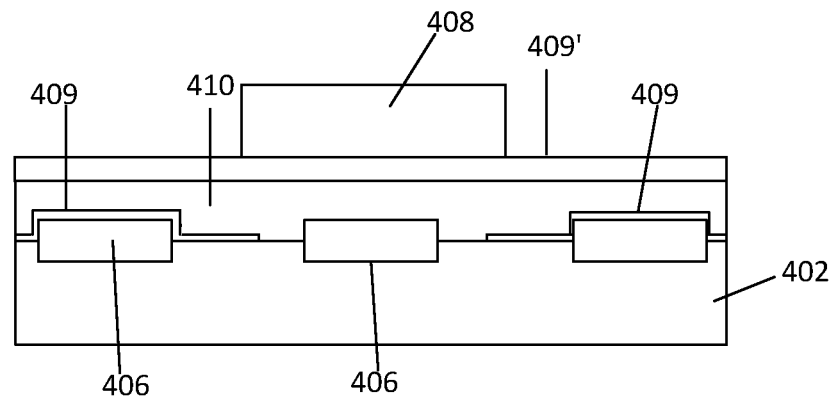
Figure 4H:
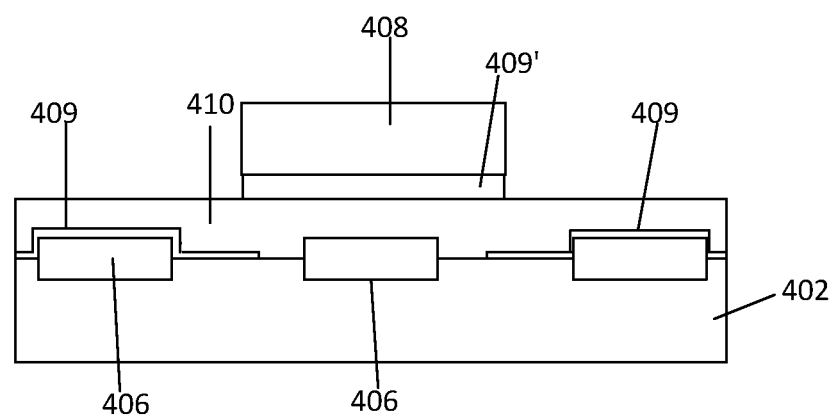
Figure 4I:
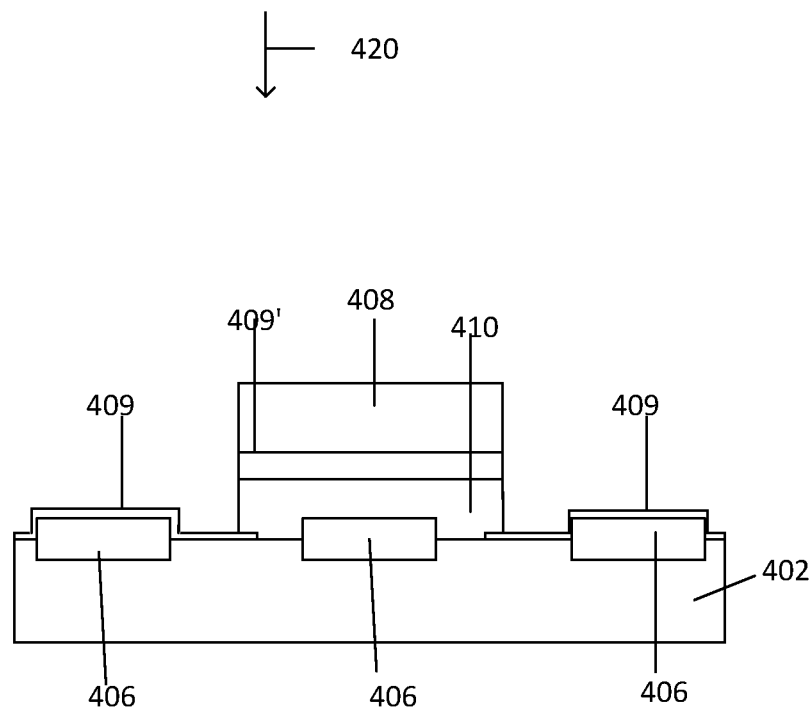
Figure 4J:
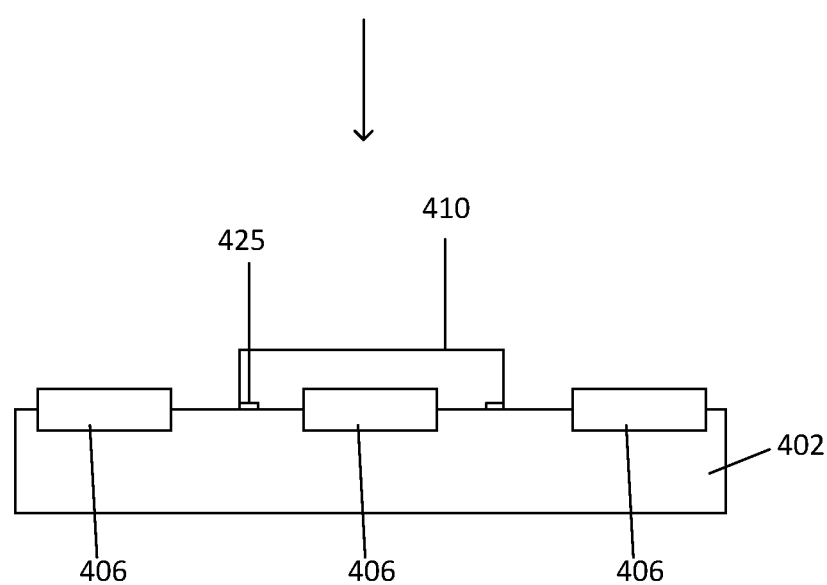

A magnetic material 410 may be formed on the conductive layer 409, on the conductive interconnect structure 406, and on exposed substrate 402 portions (FIG. 4f). The magnetic material 410 may comprise similar elements as the magnetic materials of FIG. 1, for example, and may comprise a magnetic film, in an embodiment. A second conductive layer 409' may be formed on the magnetic material 410, and a patterning material 408, such as a dry film resist, may be formed on a portion of the second conductive layer 409' (FIG. 4g). The second conductive layer 409' may be removed from the magnetic material 410, by using a flash etch process, for example (FIG. 4h). In an embodiment, a plasma etch process may be utilized to remove the magnetic material 410 from the first conductive layer 409 (FIG. 4i). The plasma process may comprise a fluorine based chemistry, in an embodiment. The first conductive material 409 may be removed from the conductive interconnect structures 406, wherein conductive structures 425 may remain within the magnetic material 410 (FIG. 4j). The conductive structures 425 may comprise a rectangular shape, and may be disposed between a sidewall of the magnetic material and the conductive structure 406.

Figure 4K:
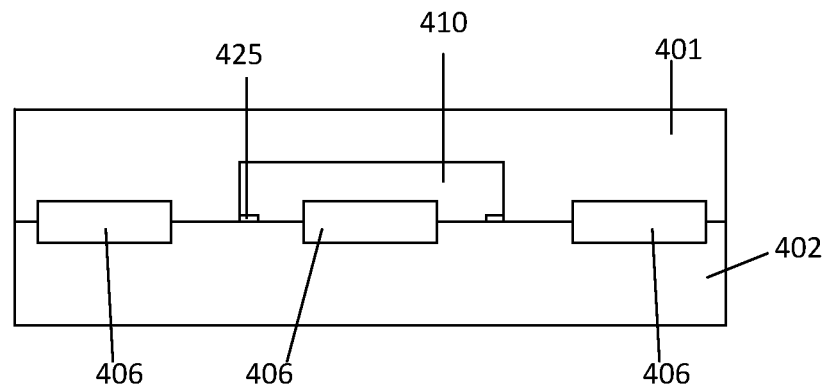
Figure 4L:
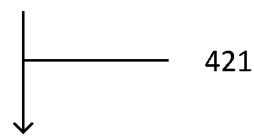
Figure 4L:
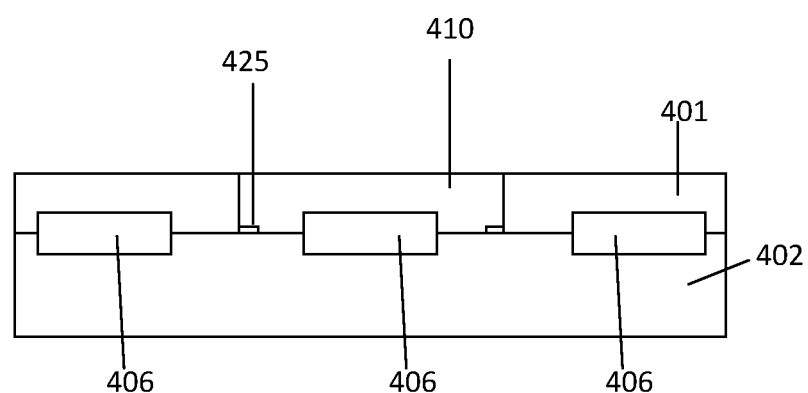
Figure 4M:
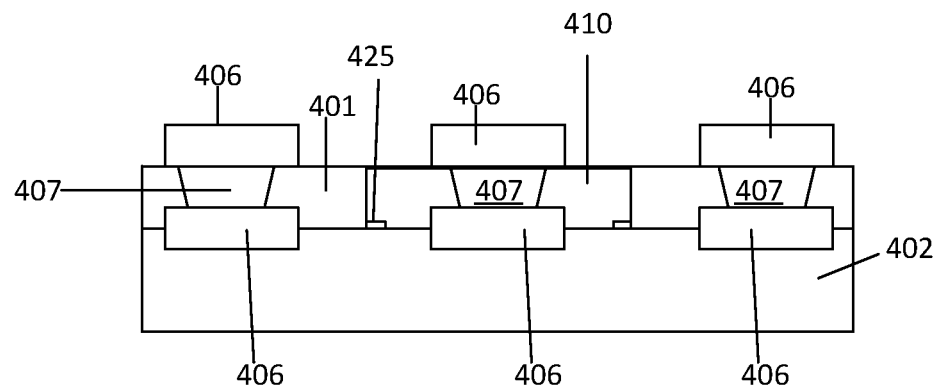
Figure 4N:
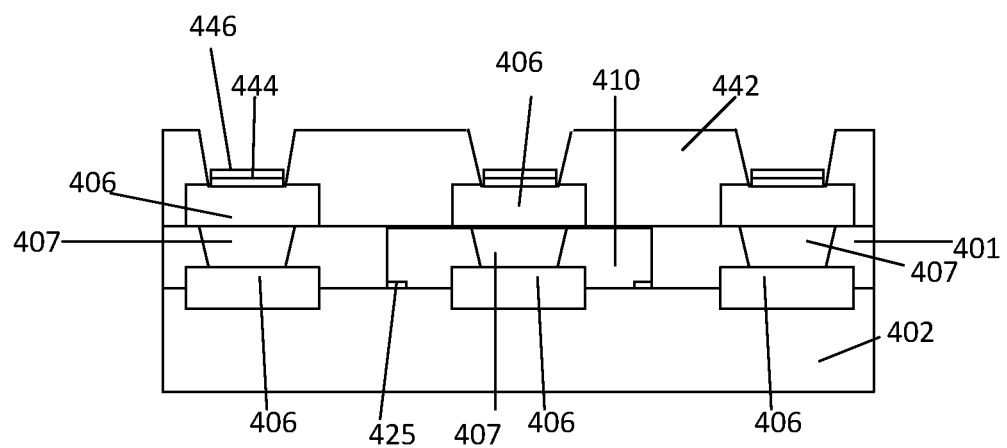
Figure 4O:
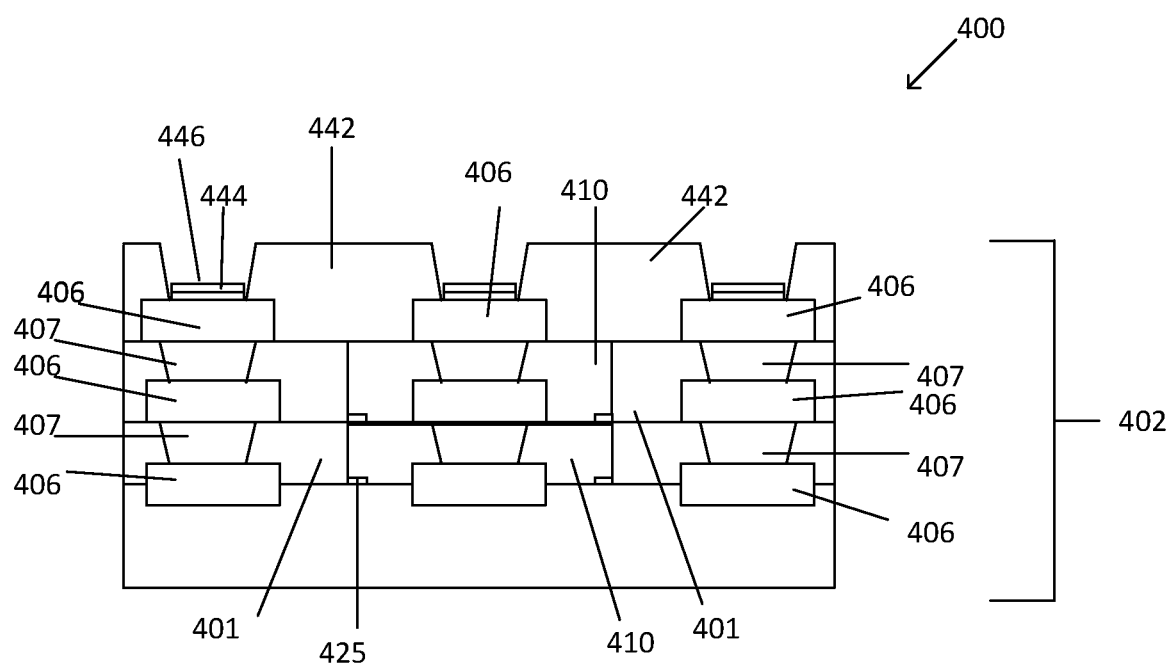

A dielectric layer 401 may be formed/laminated onto the magnetic material 410, and onto the conductive structures 406 (FIG. 4k). A grinding process 421 may then be employed, wherein the surface of the dielectric material 401 may be planarized to be coplanar with the surface of the magnetic material 410 (FIG. 4*l*). Conductive structures 407 may be formed within the magnetic material 410 and within the dielectric layer 401 (FIG. 4*m*), and conductive structures 406 may then be formed on the conductive structures 407. Further build up layers may be formed on the substrate 402, wherein any number of build up layers may be formed, wherein magnetic material may be selectively formed within the dielectric material 401 of the substrate 402. Solder material 442, solder pads 444 and surface finish 446 may be formed on the substrate 402, wherein solder structures may be formed (not shown) which may be coupled to a board or a device, in embodiments.

The number of levels of conductive traces/metallization levels that may be built up within the package structures described herein may vary according to the particular design requirements. Additional magnetic material may be formed on the initially formed magnetic material, and may be patterned according to design requirements.

Various embodiments herein enable the selective embedding of magnetic material in substrates, such as package substrates. Magnetic films, magnetic paste, and/or magnetic ink may be selectively formed within the substrate, according to embodiments herein. Selective formation of the magnetic material is advantageous since the material does not cover substantially large areas of the substrate, and avoids placement of inductors on surfaces of substrates. Covering large areas of a substrate with a magnetic material may interfere with signal integrity. The embodiments enable the selective placement of magnetic material only in certain locations within build up layers. The embodiments utilize processing techniques such as stencil printing, grinding, and plasma etching. The embodiments can be employed with both cored or coreless substrates, dielectric laminates or prepeg materials.

Figure 5A:
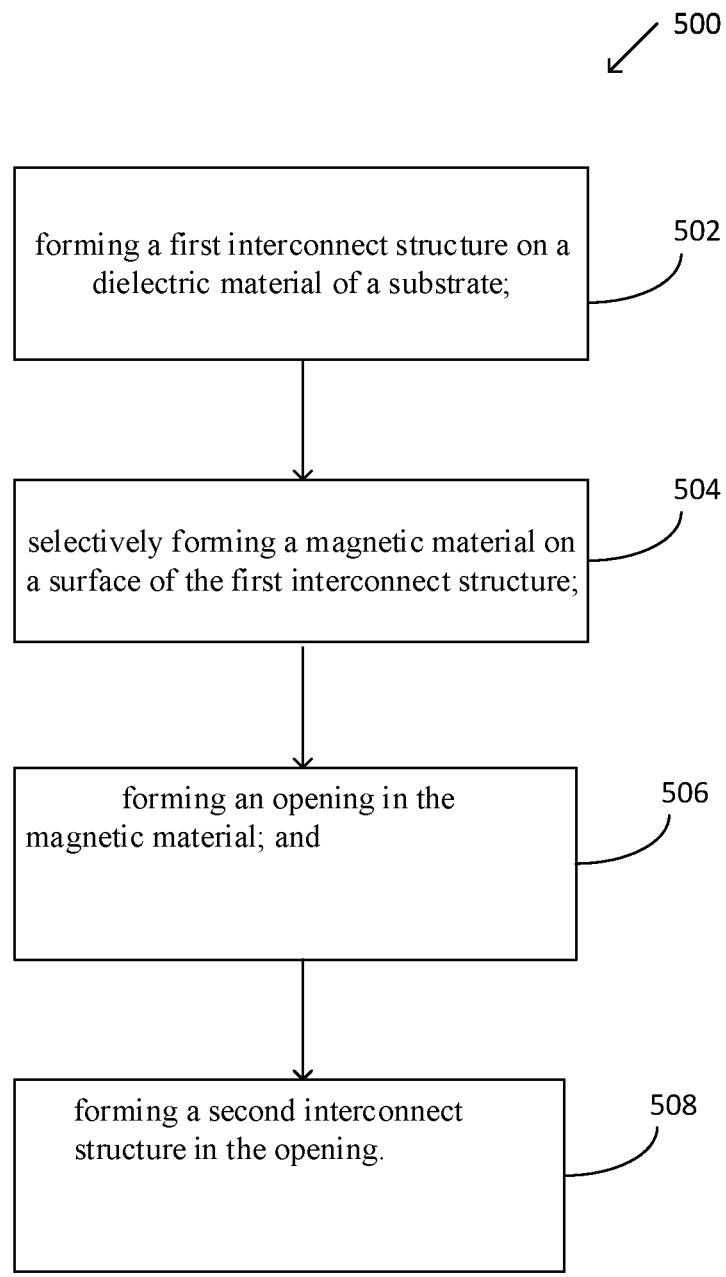
FIGS. 5a-5b represent flow charts of methods of forming package structures in accordance with some embodiments.

FIG. 5*a* depicts a flow chart of a method 500 of forming an in-package/embedded inductor structure, wherein a magnetic material is selectively electroplated to form a portion of the embedded inductor structure. At operation 502, a first interconnect structure is formed on a dielectric material of a substrate. The first interconnect structure may comprise any suitable conductive interconnect structure, such as a conductive trace, a via structure, a pad structure, for example. The substrate may comprise a package substrate, in an embodiment, or may comprise any other type of substrate, such as an interposer, for example. The substrate may comprise a cored package substrate, and may comprise an organic substrate in an embodiment, or may comprise a substrate without a core, such as a core-less substrate, for example.

At operation 504, a magnetic material may be selectively formed on a surface of the first interconnect structure. The magnetic material may comprise any of the magnetic materials described herein, such as those materials described in FIG. 1, for example. In an embodiment, the magnetic material may be formed by utilizing a stencil printing process, wherein the magnetic material may be formed within an opening within the dielectric material, wherein the opening is formed to reveal a surface of the first conductive structure. In an embodiment, the opening may comprise a cavity, such as a rectangular cavity. The opening may comprise linear sidewalls, in an embodiment.

The magnetic material may comprise a first side and a second side, wherein the first side of the magnetic material may be formed on the surface of the first interconnect structure. In an embodiment, a seed layer, such as the seed layer of FIG. 2*g*, for example, may be formed on the first interconnect structure prior to the formation of the magnetic material. Sidewalls of the magnetic material, which may comprise linear sidewalls in an embodiment, may be in direct contact with adjacent dielectric material within the substrate, in an embodiment.

The magnetic material may be selectively formed within the substrate, such that it forms a portion of an embedded inductor within the substrate; that is the magnetic material may not be disposed on a surface of the substrate, in an embodiment. In an embodiment, the magnetic material may be revealed and patterned by using a grinding process, and in another embodiment, the magnetic material may be patterned by using a plasma etching process, such as by utilizing a fluorine based chemistry.

At operation 506, an opening may be formed in the magnetic material. The opening may be formed utilizing laser drilling, for example, and may expose/reveal a surface of the first interconnect structure. At operation 508, a second interconnect structure may be formed in the opening. In an embodiment, the second interconnect structure may comprise a via, but in other embodiments, the second interconnect structure may comprise any suitable interconnect structure/trace. In an embodiment, the second interconnect structure may be formed directly on the first interconnect structure, and may be formed by an electroplating process, and may comprise a copper material, for example. In other embodiments, the second interconnect structure may be formed on a seed layer disposed between the first interconnect structure and the second interconnect structure.

By selecting the locations of the openings and/or the seed layer formation, magnetic material portions of an inductor structure may be placed at desired locations within a package substrate. The embedded inductor structures may comprise any suitable geometry within specific locations of the substrate, and may comprise structures such as those described in FIGS. 2*m*-2*n*, for example. At least one build-up layer and/or dielectric layer may be formed on the embedded inductor structure, so that the embedded inductor structure may be fully embedded within the package substrate.

Figure 5B:
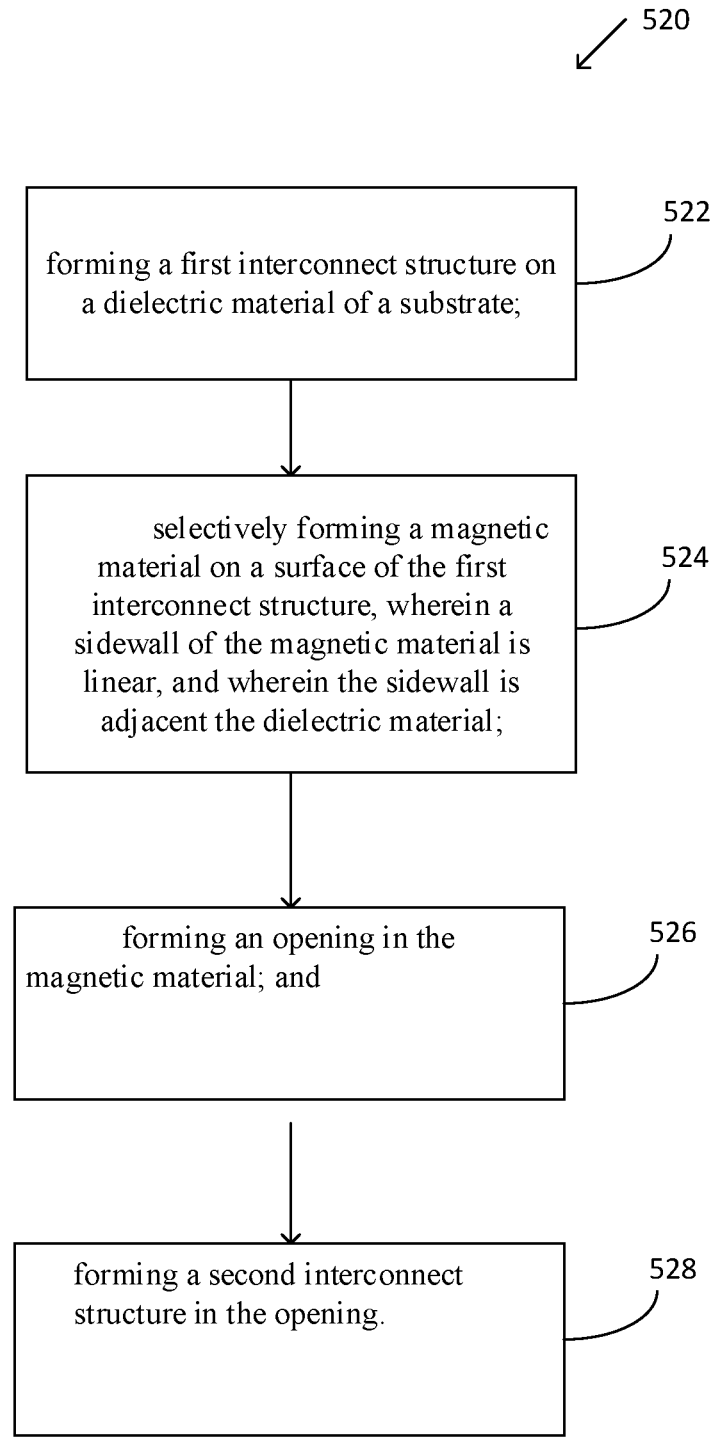

FIG. 5*b* depicts a flow chart of a method 520 of forming an embedded package inductor structure within a substrate, such as within a package substrate, wherein a magnetic material is selectively formed within the substrate. At operation 522, a first interconnect structure may be formed on a dielectric material of a substrate. The first interconnect structure may be formed utilizing a plating process, for example, and may comprise a copper material, in an embodiment. The dielectric material may comprise a build up material of either a cored or a coreless package, for example.

At operation 524, a magnetic material may be selectively formed on a surface of the first interconnect structure, wherein a sidewall of the formed magnetic material is linear, and wherein the sidewall is adjacent the dielectric material. In an embodiment, the magnetic material may be formed within an opening formed within the dielectric material. In an embodiment, the magnetic material may be formed such that the sidewalls of the magnetic material are directly adjacent the dielectric material of the substrate, and wherein a length of a first side or a length of a second side of the magnetic material is disposed between dielectric material portions of the substrate. In an embodiment, a length of either a first side or a second side of the magnetic material may be less than about 1.5 times a length of the first interconnect structure. In other embodiments, a length of a first or second side of the magnetic material may be less than a length of the first interconnect structure.

At operation 526, an opening may be formed in the magnetic material, utilizing any of the process described herein. In an embodiment, the opening may comprise a via opening. At operation 528, a second interconnect structure may be formed in the opening. The second interconnect structure may comprise a via structure, and may be formed by electroplating a conductive material within the opening, in an embodiment. In an embodiment, a seed layer may be formed within the opening prior to the formation of the magnetic material. In an embodiment, a third interconnect structure may be formed on the second interconnect structure, and an additional magnetic material may be formed on the third conductive interconnect structure. The embedded inductor structure may comprise a any suitable geometries, including those described in FIGS. 2*m*-2*n*, for example. Any number of additional build up layers may be formed on the embedded inductor structures, according to design requirements.

The package structures of the embodiments herein may be coupled with any suitable type of structures capable of providing electrical communications between a microelectronic device, such as a die, disposed in package structures, and a next-level component to which the package structures herein may be coupled (e.g., a circuit board). The device/package structures, and the components thereof, of the embodiments herein may comprise circuitry elements such as logic circuitry for use in a processor die, for example. Metallization layers and insulating material may be included in the structures herein, as well as conductive contacts/bumps that may couple metal layers/interconnects to external devices/layers. In some embodiments, the structures may further comprise a plurality of dies, which may be stacked upon one another, depending upon the particular embodiment. In an embodiment, a die(s) may be partially or fully embedded in a package structure of the embodiments herein.

The various embodiments of the device/package structures included herein may be used for system on chip (SOC) products, and may find application in such devices as smart phones, notebooks, tablets, wearable devices and other electronic mobile devices. In various implementations, the package structures herein may be included in a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder, and wearable devices. In further implementations, the package devices herein may be included in any other electronic devices that process data.

Figure 6:
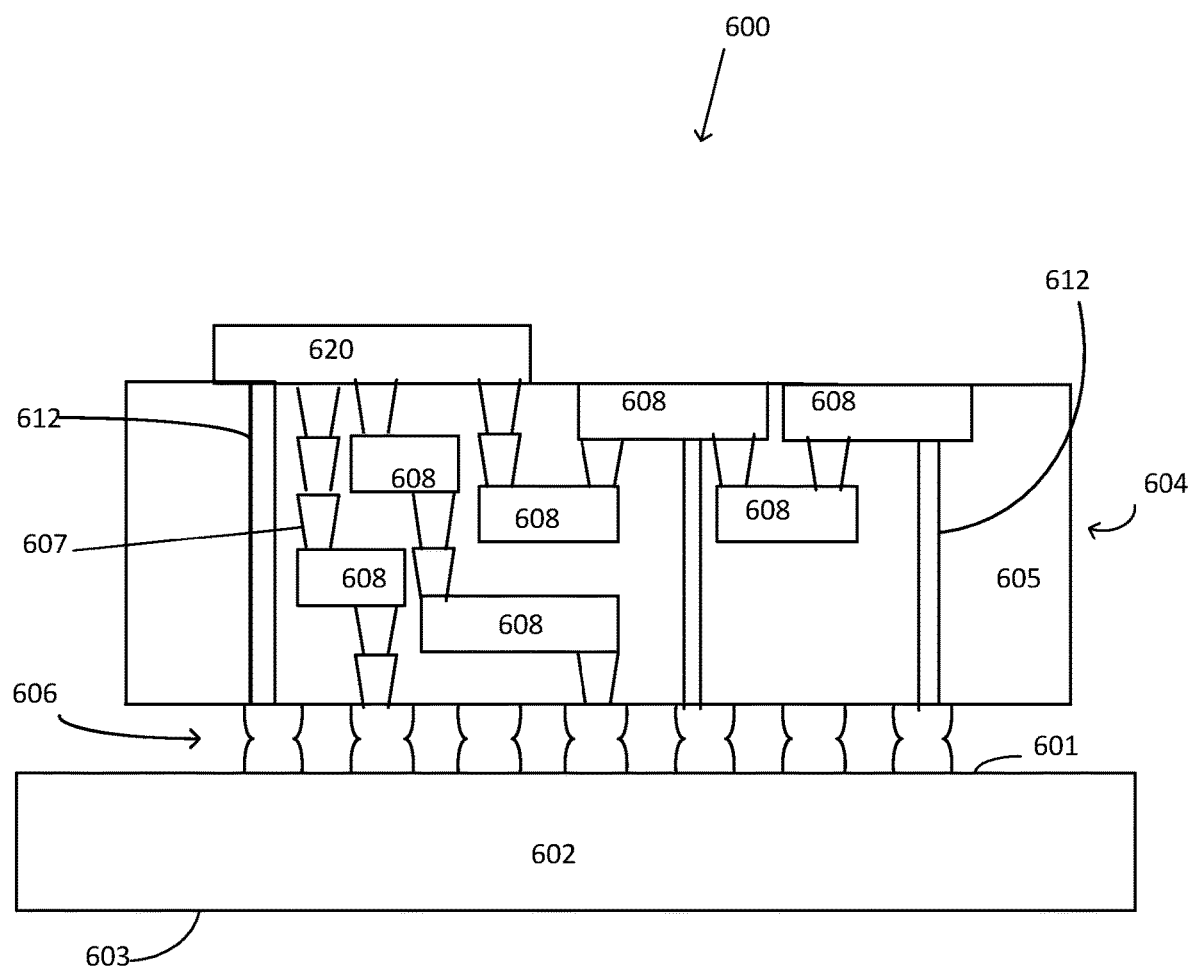
FIG. 6 represents a cross-sectional view of a computing system in accordance with embodiments.

Turning now to FIG. 6, illustrated is a cross sectional view of an embodiment of a computing system 600. The system 600 includes a mainboard 602 or other circuit board. Mainboard 602 includes a first side 601 and an opposing second side 603, and various components may be disposed on either one or both of the first and second sides 601, 603. In the illustrated embodiment, the computing system 600 includes at least one die 620, disposed on a surface (such as on a top or bottom or side surface) of a substrate 604, such as a package substrate comprising at least one of the embedded inductor structures according to any of the various embodiments herein. The substrate 604 may comprise an interposer 604, for example, or any other type of substrate, such as a cored substrate or a coreless substrate, for example.

The substrate 604 may comprise various conductive layers 608, for example, which may be electrically and physically connected to each other by via structures 607. The conductive layers 608 may comprise conductive traces in an embodiment.

The substrate 604 may further comprise through substrate vias 612, which may comprise the magnetic material on sidewalls, such as in FIG. 3*g*, for example. Dielectric material 605 may separate/isolate conductive layers from each other within the substrate 604. Joint structures 606 may electrically and physically couple the substrate 604 to the board 602. The computing system 600 may comprise any of the embodiments of the embedded inductor structures described herein.

System 600 may comprise any type of computing system, such as, for example, a hand-held or mobile computing device (e.g., a cell phone, a smart phone, a mobile internet device, a music player, a tablet computer, a laptop computer, a net top computer, etc.). However, the disclosed embodiments are not limited to hand-held and other mobile computing devices and these embodiments may find application in other types of computing systems, such as desk-top computers and servers.

Mainboard 602 may comprise any suitable type of circuit board or other substrate capable of providing electrical communication between one or more of the various components disposed on the board. In one embodiment, for example, the mainboard 602 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 601. However, it should be understood that the disclosed embodiments are not limited to the above-described PCB and, further, that mainboard 602 may comprise any other suitable substrate.

Figure 7:
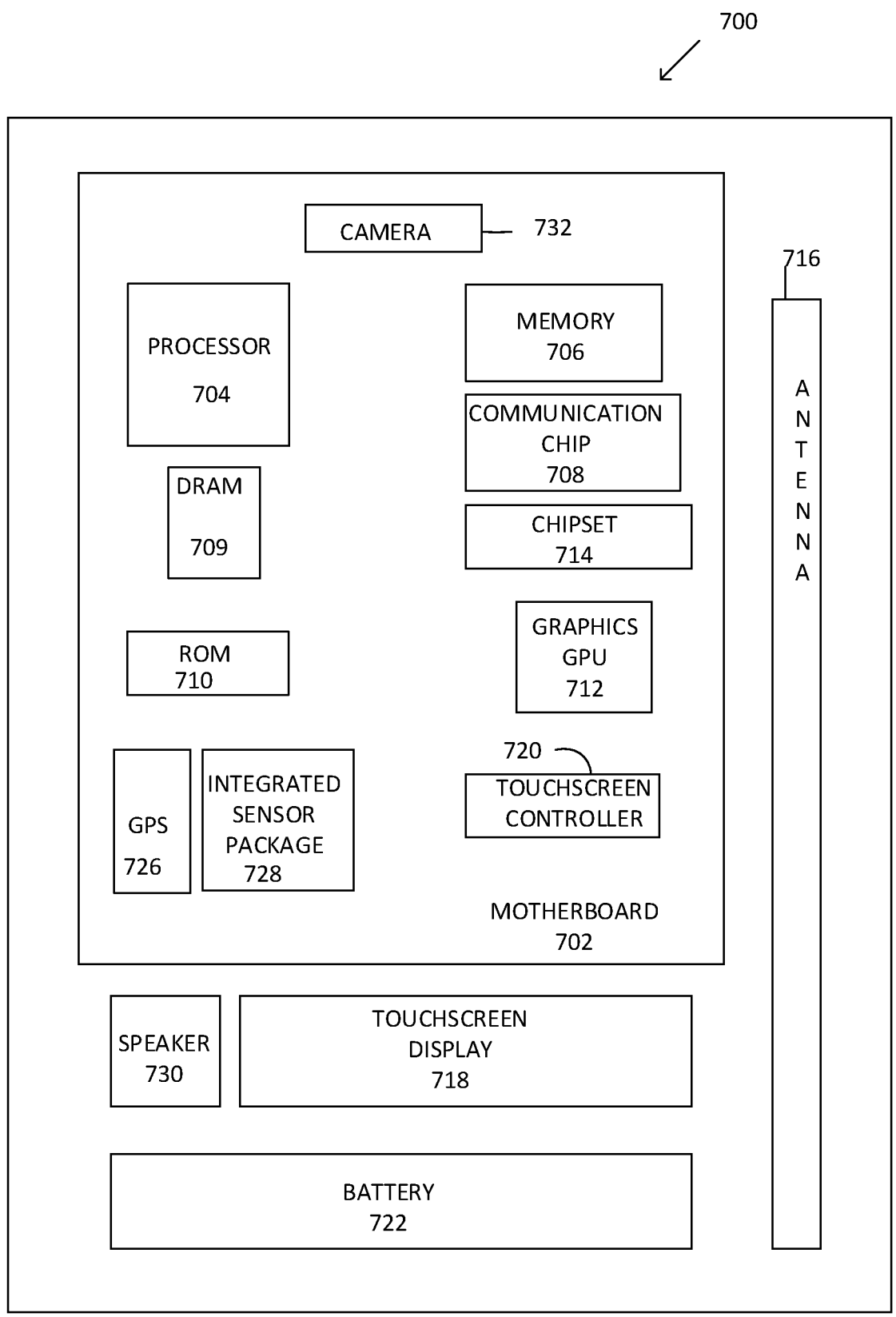
FIG. 7 represents a schematic of a computing system in accordance with embodiments.

FIG. 7 is a schematic of a computing device 700 that may be implemented incorporating embodiments of the package structures described herein. For example, any suitable ones of the components of the computing device 700 may include, or be included in, package structures comprising the embedded inductor structures of the various embodiments disclosed herein. In an embodiment, the computing device 700 houses a board 702, such as a motherboard 702 for example. The board 702 may include a number of components, including but not limited to a processor 704, an on-die memory 706, and at least one communication chip 708. The processor 704 may be physically and electrically coupled to the board 702. In some implementations the at least one communication chip 708 may be physically and electrically coupled to the board 702. In further implementations, the communication chip 708 is part of the processor 704.

Depending on its applications, computing device 700 may include other components that may or may not be physically and electrically coupled to the board 702, and may or may not be communicatively coupled to each other. These other components include, but are not limited to, volatile memory (e.g., DRAM) 709, non-volatile memory (e.g., ROM) 710, flash memory (not shown), a graphics processor unit (GPU) 712, a chipset 714, an antenna 716, a display 718 such as a touchscreen display, a touchscreen controller 720, a battery 722, an audio codec (not shown), a video codec (not shown), a global positioning system (GPS) device 726, an integrated sensor 728, a speaker 730, a camera 732, an amplifier (not shown), compact disk (CD) (not shown), digital versatile disk (DVD) (not shown), and so forth). These components may be connected to the system board 702, mounted to the system board, or combined with any of the other components.

The communication chip 708 enables wireless and/or wired communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 708 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond.

The computing device 700 may include a plurality of communication chips 608. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 700 may be a laptop, a netbook, a notebook, an ultrabook, a smartphone, a tablet, a personal digital assistant (PDA), an ultra-mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments of the package structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. For example, the above embodiments may include specific combinations of features as further provided below:

Example 1 is a microelectronic package structure, comprising: a substrate comprising a dielectric material, a first interconnect structure within the dielectric material; magnetic material, wherein a first side of the magnetic material is on a first side of the first interconnect structure; and second interconnect structure within the magnetic material, wherein; first side of the second interconnect structure is on the first side of the first interconnect structure; and second side of the second interconnect structure is coplanar with a second side of the magnetic material.

Example 2 includes the microelectronic package structure of example 1, wherein the magnetic material comprises a rectangular shape, and wherein a sidewall of the first interconnect structure is linear.

Example 3 includes the microelectronic package structure of example 1, wherein a seed layer is between the magnetic material and a sidewall of the second interconnect structure.

Example 4 includes the microelectronic package structure of example 1, wherein the first side of the second interconnect structure is directly on the first side of the first interconnect structure, and wherein the second side of the magnetic material is on the dielectric material.

Example 5 includes the microelectronic package structure of example 1, wherein the magnetic material comprises a magnetic paste, and wherein the magnetic paste comprises a carrier, and a magnetic material.

Example 6 includes the microelectronic package structure as in of any one of the preceding examples, wherein the magnetic material comprises a portion of an embedded inductor structure.

Example 7 includes the microelectronic package structure as in of any one of the preceding examples, wherein the magnetic material comprises one or more of iron, nickel, cobalt or molybdenum, their alloys, and combinations thereof.

Example 8 includes the microelectronic package structure as in of any one of the preceding examples, wherein the substrate comprises a die electrically coupled thereto.

Example 9 includes the microelectronic package structure as in of any one of the preceding examples, wherein a build-up layer is on the magnetic material.

Example 10 is a microelectronic package structure comprising: a substrate comprising a dielectric material; a magnetic material within the dielectric material, the magnetic material comprising a first side and a second side; a first interconnect structure on a first side of the magnetic material, wherein a first side of the first interconnect structure is within the magnetic material, and wherein a second side of the first interconnect structure is on the dielectric material; and a second interconnect structure on the first the side of first interconnect structure, wherein the second interconnect structure is at least partially embedded within the magnetic material.

Example 11 includes the microelectronic package structure of example 10, wherein the magnetic material comprises a magnetic paste, wherein the magnetic paste comprises iron, nickel and alloys of iron and nickel, and a carrier.

Example 12 includes the microelectronic package structure of example 10 wherein the first interconnect structure comprises a pad, and the second interconnect structure comprises a via.

Example 13 includes the microelectronic package structure of example 10, wherein the second side of the first interconnect structure is coplanar with the dielectric material.

Example 14 is the microelectronic package structure of example 10, wherein a first sidewall of the magnetic material is directly on the dielectric material, and a second sidewall of the magnetic material is directly on the dielectric material.

Example 15 includes the microelectronic package structure of example 10 wherein the substrate comprises a core, and wherein the magnetic material is above the core.

Example 16 includes the microelectronic package structure of claim 12, wherein a first side of a rectangular copper structure is on a sidewall of the magnetic material and is adjacent the first interconnect structure.

Example 17 includes the microelectronic package structure as in any one of the preceding examples, further comprising: a microprocessor; a memory; and a battery, wherein at least the microprocessor is electrically coupled to the substrate.

Example 18 is a method of forming a microelectronic package structure, the method comprising: forming a first interconnect structure on a dielectric material of a substrate; selectively forming a magnetic material on a surface of the first interconnect structure; forming an opening in the magnetic material; and forming a second interconnect structure in the opening.

Example 19 includes the method of forming the microelectronic package structure of example 18, wherein selectively forming the magnetic material comprises forming a sidewall of the magnetic material adjacent a sidewall of the first conductive material.

Example 20 includes the method of forming the microelectronic package structure of any one of the preceding examples, wherein selectively forming the magnetic material comprises: forming a dielectric layer on the first conductive interconnect structure; forming a cavity in the dielectric layer, wherein a surface of the first interconnect structure is exposed; and forming the magnetic material in the cavity, and on the surface of the first interconnect structure.

Example 21 includes the method of forming the microelectronic package structure of any of the preceding examples, wherein selectively forming the magnetic material comprises: forming the magnetic material on the surface of the first conductive interconnect structure, wherein the magnetic material is formed on the dielectric material adjacent the first conductive interconnect structure; forming a mask on the surface of the first conductive interconnect structure; and plasma etching the magnetic material adjacent the mask.

Example 22 includes the method of forming the microelectronic package structure of example 21, wherein forming the magnetic material comprises forming a magnetic film.

Example 23 incudes the method forming the microelectronic package structure of example 18, wherein forming the opening comprises: forming a dielectric layer on the magnetic material; grinding a first surface of the dielectric layer to be coplanar with a first surface of the magnetic material; and forming an opening in the magnetic material.

Example 24 includes the method of forming the microelectronic package structure as in any one of the preceding examples, wherein forming the first conductive interconnect structure comprises forming a conductive pad, and wherein forming the second conductive interconnect structure comprises forming a via.

Example 25 includes the method of forming the microelectronic package as in any one of the preceding examples wherein the magnetic material comprises nickel, iron (please add any other materials), and alloys thereof.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A method of forming a microelectronic package structure, the method comprising:
    forming a first interconnect structure on a dielectric material of a substrate;
    selectively forming a magnetic material on a surface of the first interconnect structure;
    forming a dielectric layer on the magnetic material;
    grinding a first surface of the dielectric layer to be coplanar with a first surface of the magnetic material;
    forming an opening in the magnetic material; and
    forming a second interconnect structure in the opening.

2. The method of forming the microelectronic package structure of claim 1, wherein
    selectively forming the magnetic material comprises forming a sidewall of the magnetic material adjacent a sidewall of the first interconnect structure.

3. The method of forming the microelectronic package structure of claim 1, wherein selectively forming the magnetic material comprises:
    forming a dielectric layer on the first interconnect structure;
    forming a cavity in the dielectric layer, wherein a surface of the first interconnect structure is exposed; and
    forming the magnetic material in the cavity, and on the surface of the first interconnect structure.

4. The method of forming the microelectronic package structure of claim 1, wherein selectively forming the magnetic material comprises:
    forming the magnetic material on the surface of the first interconnect structure, wherein the magnetic material is formed on the dielectric material adjacent the first interconnect structure;
    forming a mask on the surface of the first interconnect structure; and
    plasma etching the magnetic material adjacent the mask.

5. The method of forming the microelectronic package structure of claim 4, wherein forming the magnetic material comprises forming a magnetic film.

6. The method of forming the microelectronic package structure of claim 1, wherein forming the first interconnect structure comprises forming a conductive pad, and wherein forming the second interconnect structure comprises forming a via.

7. The method of forming the microelectronic package of claim 1 wherein the magnetic material comprises one or more of nickel, iron or silicon, and alloys thereof.

* * * * *